United States Patent
Abou-Alfotouh et al.

(10) Patent No.: US 9,548,714 B2
(45) Date of Patent: Jan. 17, 2017

(54) POWER CONVERTER WITH A DYNAMICALLY CONFIGURABLE CONTROLLER AND OUTPUT FILTER

(75) Inventors: Ahmed Mohamed Abou-Alfotouh, Belle Mead, NJ (US); Mirmira Ramarao Dwarakanath, Warren, NJ (US); Jeffrey Demski, Orefield, PA (US)

(73) Assignee: Altera Corporation, San Jose, CA (US)

(*) Notice: Subject to any disclaimer, the term of this patent is extended or adjusted under 35 U.S.C. 154(b) by 456 days.

(21) Appl. No.: 12/345,242

(22) Filed: Dec. 29, 2008

(65) Prior Publication Data
US 2010/0164650 A1 Jul. 1, 2010

(51) Int. Cl.
*H02M 3/158* (2006.01)
*H03H 7/01* (2006.01)

(52) U.S. Cl.
CPC ......... *H03H 7/0115* (2013.01); *H02M 3/1582* (2013.01)

(58) Field of Classification Search
CPC ... B23K 9/1031; H02M 3/156; H02M 3/1582; H03H 7/0115; H03H 15/02; H03H 15/023; H03H 15/00; H03H 9/6403; H03H 17/06; H03H 1/0007
USPC ............ 323/232, 233, 247, 248, 282, 285, 286,323/306; 333/165, 166, 167, 175, 176, 181
See application file for complete search history.

(56) References Cited

U.S. PATENT DOCUMENTS

| | | | |
|---|---|---|---|
| 1,889,398 A | 11/1932 | Bishop | |
| 2,600,473 A | 6/1952 | Brockman | |
| 3,210,707 A | 10/1965 | Constankakes | |
| 3,691,497 A | 9/1972 | Bailey et al. | |
| 3,762,039 A | 10/1973 | Douglass et al. | |
| 3,902,148 A | 8/1975 | Drees et al. | |
| 3,908,264 A | 9/1975 | Friberg et al. | |
| 3,947,699 A * | 3/1976 | Whitmer | 327/72 |
| 4,016,461 A | 4/1977 | Roland | |

(Continued)

FOREIGN PATENT DOCUMENTS

| GB | 2 041 818 A | 9/1980 |
|---|---|---|
| JP | 6-251958 | 9/1980 |

(Continued)

OTHER PUBLICATIONS

IEEE, 2000, IEEE standards 100-2000, 10.1109/IEEESTD.2000.322223, pp. 1162-1163.*

(Continued)

*Primary Examiner* — Gustavo Rosario Benitez
(74) *Attorney, Agent, or Firm* — Fletcher Yoder, P.C.

(57) ABSTRACT

A controller and an output filter for a power converter, and a power converter employing at least one of the same. In one embodiment, the controller includes an error amplifier with first and second input terminals coupled to one of an operating characteristic and a reference voltage of the power converter, and a switch configured to couple the first and second input terminals to one of the operating characteristic and the reference voltage as a function of a power conversion mode of the power converter. In one embodiment, the output filter includes an output filter capacitor with a first terminal coupled to a first output terminal of a power converter, and an output filter inductor coupled between a second terminal of the output filter capacitor and a second output terminal of the power converter.

20 Claims, 12 Drawing Sheets

(56) References Cited

U.S. PATENT DOCUMENTS

| | | |
|---|---|---|
| 4,101,389 A | 7/1978 | Uedaira |
| 4,103,267 A | 7/1978 | Olschewski |
| 4,187,128 A | 2/1980 | Billings et al. |
| 4,199,743 A | 4/1980 | Martincic |
| 4,247,953 A * | 1/1981 | Shinagawa et al. ....... 455/191.2 |
| 4,433,927 A | 2/1984 | Cavallari |
| 4,586,436 A | 5/1986 | Denney et al. |
| 4,636,752 A | 1/1987 | Saito |
| 4,654,770 A | 3/1987 | Santurtun et al. |
| 4,668,310 A | 5/1987 | Kudo et al. |
| 4,681,718 A | 7/1987 | Oldham |
| 4,689,735 A * | 8/1987 | Young .................. H02J 3/1835 323/356 |
| 4,751,199 A | 6/1988 | Phy |
| 4,754,317 A | 6/1988 | Comstock et al. |
| 4,761,725 A | 8/1988 | Henze |
| 4,777,465 A | 10/1988 | Meinel |
| 4,801,816 A | 1/1989 | Merlo et al. |
| 4,808,118 A | 2/1989 | Wilson et al. |
| 4,847,986 A | 7/1989 | Meinel |
| 4,870,224 A | 9/1989 | Smith et al. |
| 4,912,622 A | 3/1990 | Steigerwald et al. |
| 4,916,522 A | 4/1990 | Cohn |
| 4,975,671 A | 12/1990 | Dirks |
| 4,982,353 A | 1/1991 | Jacob et al. |
| 5,056,214 A | 10/1991 | Holt |
| 5,059,278 A | 10/1991 | Cohen et al. |
| 5,096,513 A | 3/1992 | Sawa et al. |
| 5,118,298 A | 6/1992 | Murphy |
| 5,161,098 A | 11/1992 | Balakrishnan |
| 5,187,119 A | 2/1993 | Cech et al. |
| 5,245,228 A | 9/1993 | Harter |
| 5,258,662 A | 11/1993 | Skovmand |
| 5,262,296 A | 11/1993 | Ogawa et al. |
| 5,279,988 A | 1/1994 | Saadat et al. |
| 5,285,369 A | 2/1994 | Balakrishnan |
| 5,345,670 A | 9/1994 | Pitzele et al. |
| 5,353,001 A | 10/1994 | Meinel et al. |
| 5,371,415 A | 12/1994 | Dixon et al. |
| 5,414,341 A | 5/1995 | Brown |
| 5,428,245 A | 6/1995 | Lin et al. |
| 5,436,409 A | 7/1995 | Sawada et al. |
| 5,457,624 A | 10/1995 | Hastings |
| 5,469,334 A | 11/1995 | Balakrishnan |
| 5,481,219 A | 1/1996 | Jacobs et al. |
| 5,484,494 A | 1/1996 | Oda et al. |
| 5,510,739 A | 4/1996 | Caravella et al. |
| 5,524,334 A | 6/1996 | Boesel |
| 5,541,541 A | 7/1996 | Salamina et al. |
| 5,548,206 A | 8/1996 | Soo |
| 5,561,438 A | 10/1996 | Nakazawa et al. |
| 5,568,044 A | 10/1996 | Bittner |
| 5,574,273 A | 11/1996 | Nakagawa et al. |
| 5,574,420 A | 11/1996 | Roy et al. |
| 5,578,261 A | 11/1996 | Manzione et al. |
| 5,592,072 A | 1/1997 | Brown |
| 5,594,324 A | 1/1997 | Canter et al. |
| 5,625,312 A | 4/1997 | Kawakami et al. |
| 5,689,213 A | 11/1997 | Sher |
| 5,692,296 A | 12/1997 | Variot |
| 5,731,965 A * | 3/1998 | Cheng et al. ................... 363/41 |
| 5,783,025 A | 7/1998 | Hwang et al. |
| 5,787,569 A | 8/1998 | Lotfi et al. |
| 5,788,854 A | 8/1998 | Desaigoudar et al. |
| 5,796,276 A | 8/1998 | Phillips et al. |
| 5,802,702 A | 9/1998 | Fleming et al. |
| 5,807,959 A | 9/1998 | Wu et al. |
| 5,834,691 A | 11/1998 | Aoki |
| 5,835,350 A | 11/1998 | Stevens |
| 5,837,155 A | 11/1998 | Inagaki et al. |
| 5,846,441 A | 12/1998 | Roh |
| 5,864,225 A | 1/1999 | Bryson |
| 5,877,611 A | 3/1999 | Brkovic |
| 5,898,991 A | 5/1999 | Fogel et al. |
| 5,912,589 A | 6/1999 | Khoury et al. |
| 5,920,249 A | 7/1999 | Huss |
| 5,973,923 A | 10/1999 | Jitaru |
| 5,977,811 A | 11/1999 | Magazzu |
| 5,998,925 A | 12/1999 | Shimizu et al. |
| 6,005,377 A | 12/1999 | Chen et al. |
| 6,060,176 A | 5/2000 | Semkow et al. |
| 6,081,997 A | 7/2000 | Chia et al. |
| 6,094,123 A | 7/2000 | Roy |
| 6,101,218 A | 8/2000 | Nagano |
| 6,118,351 A | 9/2000 | Kossives et al. |
| 6,118,360 A | 9/2000 | Neff |
| 6,160,721 A | 12/2000 | Kossives et al. |
| 6,169,433 B1 | 1/2001 | Farrenkopf |
| 6,201,429 B1 | 3/2001 | Rosenthal |
| 6,211,706 B1 | 4/2001 | Choi et al. |
| 6,222,403 B1 | 4/2001 | Mitsuda |
| 6,239,509 B1 | 5/2001 | Rader, III et al. |
| 6,255,714 B1 | 7/2001 | Kossives et al. |
| 6,262,564 B1 | 7/2001 | Kanamori |
| 6,285,209 B1 | 9/2001 | Sawai |
| 6,285,539 B1 | 9/2001 | Kashimoto et al. |
| 6,288,920 B1 | 9/2001 | Jacobs et al. |
| 6,317,948 B1 | 11/2001 | Kola et al. |
| 6,320,449 B1 | 11/2001 | Capici et al. |
| 6,353,379 B1 | 3/2002 | Busletta et al. |
| 6,366,486 B1 | 4/2002 | Chen et al. |
| 6,388,468 B1 | 5/2002 | Li |
| 6,407,579 B1 | 6/2002 | Goswick |
| 6,407,594 B1 | 6/2002 | Milazzo et al. |
| 6,440,750 B1 | 8/2002 | Feygenson et al. |
| 6,452,368 B1 | 9/2002 | Basso et al. |
| 6,466,454 B1 | 10/2002 | Jitaru |
| 6,477,065 B2 | 11/2002 | Parks |
| 6,479,981 B2 | 11/2002 | Schweitzer, Jr. et al. |
| 6,495,019 B1 | 12/2002 | Filas et al. |
| 6,541,819 B2 | 4/2003 | Lotfi et al. |
| 6,541,984 B2 * | 4/2003 | Kobuchi .............. G01R 31/002 324/637 |
| 6,549,409 B1 | 4/2003 | Saxelby, Jr. et al. |
| 6,552,629 B2 * | 4/2003 | Dixon et al. .................. 333/172 |
| 6,570,413 B1 | 5/2003 | Kumagai et al. |
| 6,573,694 B2 | 6/2003 | Pulkin et al. |
| 6,578,253 B1 | 6/2003 | Herbert |
| 6,580,258 B2 | 6/2003 | Wilcox et al. |
| 6,608,332 B2 | 8/2003 | Shimizu et al. |
| 6,621,256 B2 | 9/2003 | Muratov et al. |
| 6,624,498 B2 | 9/2003 | Filas et al. |
| 6,639,427 B2 | 10/2003 | Dray et al. |
| 6,649,422 B2 | 11/2003 | Kossives et al. |
| 6,650,169 B2 | 11/2003 | Faye et al. |
| 6,661,216 B1 | 12/2003 | Grant et al. |
| 6,691,398 B2 | 2/2004 | Gutierrez |
| 6,693,805 B1 * | 2/2004 | Steigerwald et al. .......... 363/39 |
| 6,731,002 B2 | 5/2004 | Choi |
| 6,747,538 B2 | 6/2004 | Kuwata et al. |
| 6,759,836 B1 | 7/2004 | Black, Jr. |
| 6,790,379 B2 | 9/2004 | Aoki et al. |
| 6,791,305 B2 | 9/2004 | Imai et al. |
| 6,806,807 B2 | 10/2004 | Cayne et al. |
| 6,808,807 B2 | 10/2004 | Anand et al. |
| 6,815,936 B2 | 11/2004 | Wiktor et al. |
| 6,822,882 B1 | 11/2004 | Jacobs et al. |
| 6,828,825 B2 | 12/2004 | Johnson et al. |
| 6,856,007 B2 | 2/2005 | Warner |
| 6,879,137 B2 | 4/2005 | Sase et al. |
| 6,912,781 B2 | 7/2005 | Morrison et al. |
| 6,922,044 B2 | 7/2005 | Walters et al. |
| 6,922,130 B2 | 7/2005 | Okamoto |
| 6,984,968 B2 | 1/2006 | Moon |
| 6,989,121 B2 | 1/2006 | Thummel |
| 6,998,952 B2 | 2/2006 | Zhou et al. |
| 7,015,544 B2 | 3/2006 | Lotfi et al. |
| 7,019,505 B2 | 3/2006 | Dwarakanath et al. |
| 7,020,295 B2 | 3/2006 | Hamada et al. |
| 7,021,518 B2 | 4/2006 | Kossives et al. |
| 7,023,315 B2 | 4/2006 | Yeo et al. |
| 7,038,438 B2 | 5/2006 | Dwarakanath et al. |
| 7,038,514 B2 | 5/2006 | Leith et al. |
| 7,057,486 B2 | 6/2006 | Kiko |

(56) References Cited

U.S. PATENT DOCUMENTS

| | | |
|---|---|---|
| 7,061,217 B2 | 6/2006 | Bayer et al. |
| 7,101,737 B2 | 9/2006 | Cobbley |
| 7,102,419 B2 | 9/2006 | Lou et al. |
| 7,109,688 B1 | 9/2006 | Chiu et al. |
| 7,148,670 B2 | 12/2006 | Inn et al. |
| 7,157,888 B2 | 1/2007 | Chen et al. |
| 7,175,718 B2 | 2/2007 | Nobutoki et al. |
| 7,180,395 B2 | 2/2007 | Lotfi et al. |
| 7,190,150 B2 | 3/2007 | Chen et al. |
| 7,214,985 B2 | 5/2007 | Lotfi et al. |
| 7,229,886 B2 | 6/2007 | Lotfi et al. |
| 7,230,302 B2 | 6/2007 | Lotfi et al. |
| 7,230,316 B2 | 6/2007 | Yamazaki et al. |
| 7,232,733 B2 | 6/2007 | Lotfi et al. |
| 7,235,955 B2 | 6/2007 | Solie |
| 7,236,086 B1 | 6/2007 | Vinciarelli et al. |
| 7,244,994 B2 | 7/2007 | Lotfi et al. |
| 7,250,842 B1 | 7/2007 | Johnson et al. |
| 7,256,674 B2 | 8/2007 | Lotfi et al. |
| 7,276,998 B2 | 10/2007 | Lotfi et al. |
| 7,297,631 B2 | 11/2007 | Nair et al. |
| 7,319,311 B2 | 1/2008 | Nishida |
| 7,330,017 B2 | 2/2008 | Dwarakanath et al. |
| 7,348,829 B2 | 3/2008 | Choy et al. |
| 7,352,162 B1 | 4/2008 | Chang et al. |
| 7,368,897 B2 | 5/2008 | Qahouq et al. |
| 7,414,507 B2 | 8/2008 | Giandalia et al. |
| 7,423,508 B2 | 9/2008 | Gardner et al. |
| 7,426,780 B2 | 9/2008 | Lotfi et al. |
| 7,434,306 B2 | 10/2008 | Gardner |
| 7,462,317 B2 | 12/2008 | Lotfi et al. |
| 7,482,795 B2 | 1/2009 | Parto et al. |
| 7,482,796 B2 | 1/2009 | Nishida |
| 7,498,522 B2 | 3/2009 | Itoh |
| 7,501,805 B2 | 3/2009 | Chen et al. |
| 7,521,907 B2 | 4/2009 | Cervera et al. |
| 7,522,432 B2 | 4/2009 | Shimizu |
| 7,544,995 B2 | 6/2009 | Lotfi |
| 7,598,606 B2 | 10/2009 | Chow et al. |
| 7,602,167 B2 | 10/2009 | Trafton et al. |
| 7,610,022 B1 * | 10/2009 | Teo et al. ......................... 455/73 |
| 7,612,603 B1 | 11/2009 | Petricek et al. |
| 7,635,910 B2 | 12/2009 | Sinaga et al. |
| 7,642,762 B2 | 1/2010 | Xie et al. |
| 7,676,402 B2 | 3/2010 | Moody |
| 7,679,341 B2 | 3/2010 | Chen |
| 7,679,342 B2 | 3/2010 | Lopata et al. |
| 7,688,172 B2 | 3/2010 | Lotfi et al. |
| 7,710,093 B2 | 5/2010 | Dwarakanath et al. |
| 7,714,558 B2 | 5/2010 | Wu |
| 7,728,573 B2 | 6/2010 | Capilla et al. |
| 7,733,072 B2 | 6/2010 | Kanakubo |
| 7,746,041 B2 | 6/2010 | Xu et al. |
| 7,746,042 B2 | 6/2010 | Williams et al. |
| 7,786,837 B2 | 8/2010 | Hebert |
| 7,790,500 B2 | 9/2010 | Ramos et al. |
| 7,791,324 B2 | 9/2010 | Mehas et al. |
| 7,791,440 B2 | 9/2010 | Ramadan et al. |
| 7,838,395 B2 | 11/2010 | Badakere et al. |
| 7,859,233 B1 | 12/2010 | Silva et al. |
| 7,876,080 B2 | 1/2011 | Dwarakanath et al. |
| 7,876,572 B2 | 1/2011 | Sota |
| 7,888,926 B2 | 2/2011 | Ishino |
| 7,893,676 B2 | 2/2011 | Hanna |
| 7,911,294 B2 | 3/2011 | Harada et al. |
| 7,914,808 B2 | 3/2011 | Malaviya et al. |
| 7,936,160 B1 * | 5/2011 | Sheehan .......................... 323/285 |
| 7,948,280 B2 | 5/2011 | Dwarakanath et al. |
| 7,948,772 B2 | 5/2011 | Tung et al. |
| 7,974,103 B2 | 7/2011 | Lim et al. |
| 8,013,580 B2 | 9/2011 | Cervera et al. |
| 8,018,212 B1 * | 9/2011 | Petricek .............. H02M 3/1582 323/259 |
| 8,018,315 B2 | 9/2011 | Lotfi et al. |
| 8,030,908 B2 | 10/2011 | Huang |
| 8,085,106 B2 | 12/2011 | Huda et al. |
| 8,109,587 B2 | 2/2012 | Ishizaki |
| 8,154,261 B2 | 4/2012 | Lopata et al. |
| 8,283,901 B2 | 10/2012 | Lopata et al. |
| 8,410,769 B2 | 4/2013 | Lopata et al. |
| 8,541,991 B2 | 9/2013 | Lopata et al. |
| 8,686,698 B2 | 4/2014 | Lopata et al. |
| 8,692,532 B2 | 4/2014 | Lopata et al. |
| 8,698,463 B2 | 4/2014 | Dwarakanath et al. |
| 2001/0030595 A1 | 10/2001 | Hamatani et al. |
| 2001/0033015 A1 | 10/2001 | Corisis |
| 2001/0041384 A1 | 11/2001 | Ohgiyama et al. |
| 2002/0008566 A1 | 1/2002 | Taito et al. |
| 2002/0024873 A1 | 2/2002 | Tomishima et al. |
| 2002/0031032 A1 | 3/2002 | Ooishi |
| 2002/0076851 A1 | 6/2002 | Eden et al. |
| 2002/0135338 A1 | 9/2002 | Hobrecht et al. |
| 2002/0153258 A1 | 10/2002 | Filas et al. |
| 2002/0175661 A1 | 11/2002 | Wheeler et al. |
| 2003/0062541 A1 | 4/2003 | Warner |
| 2003/0076662 A1 | 4/2003 | Miehling |
| 2003/0189869 A1 | 10/2003 | Yamagata et al. |
| 2003/0232196 A1 | 12/2003 | Anand et al. |
| 2004/0125621 A1 | 7/2004 | Yang et al. |
| 2004/0130428 A1 | 7/2004 | Mignano et al. |
| 2004/0150500 A1 | 8/2004 | Kiko |
| 2004/0169498 A1 | 9/2004 | Goder et al. |
| 2004/0246077 A1 * | 12/2004 | Misu et al. .................... 333/195 |
| 2005/0011672 A1 | 1/2005 | Alawani et al. |
| 2005/0035747 A1 | 2/2005 | Mullett |
| 2005/0046405 A1 | 3/2005 | Trafton et al. |
| 2005/0088216 A1 | 4/2005 | Arndt et al. |
| 2005/0167756 A1 | 8/2005 | Lotfi et al. |
| 2005/0168203 A1 | 8/2005 | Dwarakanath et al. |
| 2005/0168205 A1 | 8/2005 | Dwarakanath et al. |
| 2005/0169024 A1 | 8/2005 | Dwarakanath et al. |
| 2005/0212132 A1 | 9/2005 | Hsuan et al. |
| 2006/0009023 A1 | 1/2006 | Nair et al. |
| 2006/0038225 A1 | 2/2006 | Lotfi et al. |
| 2006/0096087 A1 | 5/2006 | Lotfi et al. |
| 2006/0096088 A1 | 5/2006 | Lotfi et al. |
| 2006/0097831 A1 | 5/2006 | Lotfi et al. |
| 2006/0097832 A1 | 5/2006 | Lotfi et al. |
| 2006/0097833 A1 | 5/2006 | Lotfi et al. |
| 2006/0109072 A1 | 5/2006 | Giandalia et al. |
| 2006/0132217 A1 | 6/2006 | Lou et al. |
| 2006/0145800 A1 | 7/2006 | Dadafshar et al. |
| 2006/0197207 A1 | 9/2006 | Chow et al. |
| 2006/0197583 A1 | 9/2006 | Yen et al. |
| 2006/0239046 A1 | 10/2006 | Zane et al. |
| 2006/0294437 A1 | 12/2006 | Washburn et al. |
| 2007/0023892 A1 | 2/2007 | Gauche et al. |
| 2007/0025092 A1 | 2/2007 | Lee et al. |
| 2007/0074386 A1 | 4/2007 | Lotfi et al. |
| 2007/0075815 A1 | 4/2007 | Lotfi et al. |
| 2007/0075816 A1 | 4/2007 | Lotfi et al. |
| 2007/0075817 A1 | 4/2007 | Lotfi et al. |
| 2007/0109700 A1 | 5/2007 | Shimogawa et al. |
| 2007/0164721 A1 | 7/2007 | Han |
| 2007/0210777 A1 * | 9/2007 | Cervera et al. .............. 323/284 |
| 2007/0246808 A1 | 10/2007 | Ewe et al. |
| 2007/0253229 A1 * | 11/2007 | Dowlatabadi .......... H02M 1/36 363/49 |
| 2007/0296383 A1 | 12/2007 | Xu et al. |
| 2008/0010075 A1 | 1/2008 | Moody |
| 2008/0018366 A1 | 1/2008 | Hanna |
| 2008/0055944 A1 | 3/2008 | Wang et al. |
| 2008/0079405 A1 | 4/2008 | Shimizu |
| 2008/0090079 A1 | 4/2008 | Fajardo et al. |
| 2008/0094114 A1 | 4/2008 | Dwarakanath et al. |
| 2008/0106246 A1 | 5/2008 | Dwarakanath et al. |
| 2008/0180075 A1 * | 7/2008 | Xie et al. ...................... 323/282 |
| 2008/0258274 A1 | 10/2008 | Sinaga et al. |
| 2008/0258278 A1 | 10/2008 | Ramos et al. |
| 2008/0301929 A1 | 12/2008 | Lotfi et al. |
| 2009/0004774 A1 | 1/2009 | Lee et al. |
| 2009/0057822 A1 | 3/2009 | Wen et al. |
| 2009/0058375 A1 * | 3/2009 | Gibson et al. ................ 323/225 |
| 2009/0065964 A1 | 3/2009 | Lotfi et al. |

(56) References Cited

U.S. PATENT DOCUMENTS

| | | |
|---|---|---|
| 2009/0066300 A1 | 3/2009 | Lotfi et al. |
| 2009/0066467 A1 | 3/2009 | Lotfi et al. |
| 2009/0066468 A1 | 3/2009 | Lotfi et al. |
| 2009/0068347 A1 | 3/2009 | Lotfi et al. |
| 2009/0068400 A1 | 3/2009 | Lotfi et al. |
| 2009/0068761 A1 | 3/2009 | Lotfi et al. |
| 2009/0146297 A1 | 6/2009 | Badakere et al. |
| 2009/0167267 A1 | 7/2009 | Dwarakanath et al. |
| 2009/0212751 A1 | 8/2009 | Cervera et al. |
| 2009/0224823 A1 | 9/2009 | Gyohten et al. |
| 2009/0261791 A1 | 10/2009 | Lopata et al. |
| 2009/0295503 A1* | 12/2009 | Harada et al. .......... 333/174 |
| 2010/0072816 A1 | 3/2010 | Kenkare et al. |
| 2010/0084750 A1 | 4/2010 | Lotfi et al. |
| 2010/0087036 A1 | 4/2010 | Lotfi et al. |
| 2010/0110794 A1 | 5/2010 | Kim et al. |
| 2010/0111179 A1 | 5/2010 | Chujoh et al. |
| 2010/0164449 A1 | 7/2010 | Dwarakanath et al. |
| 2010/0212150 A1 | 8/2010 | Lotfi et al. |
| 2010/0214746 A1 | 8/2010 | Lotfi et al. |
| 2011/0095742 A1 | 4/2011 | Lopata et al. |
| 2011/0101933 A1 | 5/2011 | Lopata et al. |
| 2011/0101934 A1 | 5/2011 | Lopata et al. |
| 2011/0101948 A1 | 5/2011 | Lopata et al. |
| 2011/0101949 A1 | 5/2011 | Lopata et al. |
| 2011/0181383 A1 | 7/2011 | Lotfi et al. |
| 2012/0153912 A1 | 6/2012 | Demski et al. |
| 2012/0154013 A1 | 6/2012 | Mera et al. |
| 2012/0176105 A1 | 7/2012 | Chang et al. |
| 2013/0293203 A1 | 11/2013 | Chen et al. |
| 2013/0320951 A1 | 12/2013 | Wu et al. |

FOREIGN PATENT DOCUMENTS

| | | |
|---|---|---|
| JP | 1072517 A | 3/1989 |
| JP | 2-228013 A | 9/1990 |
| JP | 5-315885 | 11/1993 |

OTHER PUBLICATIONS

Crecraft adn Gergely, Analog Electronics, Butterworth-Heinemann, First Pulished 2002, p. 242.*

Betancourt-Zamora, R.J., et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

Goodman, J., et al., "An Energy/Security Scalable Encryption Processor Using an Embedded Variable Voltage DC/DC Converter," IEEE Journal of Solid-State Circuits, Nov. 1998, pp. 1799-1809, vol. 33, No. 11, IEEE, Los Alamitos, CA.

Horowitz, P., et al., "The Art of Electronics," Second Edition, 1989, Chapter 5: Active Filters and Oscillators, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, pp. 833-845, vol. 89, No. 6, IEEE, Los Alamitos, CA.

Sato, M., et al., "Influences of Molding Conditions on Die-pad Behavior in IC Encapsulation Process Analyzed by Hall Element Method," IEEE Transactions on Advanced Packaging, Aug. 2000, pp. 574-581, vol. 23, No. 3, IEEE, Los Alamitos, CA.

"Technical Specification: PMF 8000 Series: POL Regulator, Input 10.8-13.2 V, Output 10 A/55 W," EN/LZT 146 318 R1C, Sep. 2006, pp. 1-47, Ericsson Power Modules AB, Stockholm, Sweden.

"Linear Technology: LTC3736-1: Dual 2-Phase, No RSENSETM, Synchronous Controller with Spread Spectrum," 2004, 28 pp., Linear Technology Corporation, Milpitas, CA.

"Automotive Grade AUIRS2016S (TR) High Side Driver with Internal Vs Recharge," International Rectifier, Datasheet, Jan. 26, 2009, 23 pages.

"TPS40100: Midrange Input Synchronous Buck Controller with Advanced Sequencing and Output Margining," May 2005, 37 pp., Texas Instruments Incorporated, Dallas, TX.

Barrado, A., et al., "New DC/DC Converter with Low Output Voltage and Fast Transient Response," Proceedings of the IEEE Applied Power Electronics Conference, 2003, pp. 432-437, IEEE, Los Alamitos,CA.

Chhawchharia, P., et al., "On the Reduction of Component Count in Switched Capacitor DC/DC Converters," IEEE, Jun. 1997, pp. 1395-1401.

Goder, D., et al., "V2 Architecture Provides Ultra-Fast Transient Response in Switch Mode Power Supplies," Proceedings of HFPC Power Conversion, 1996, pp. 414-420.

Patella, B.J., et al., "High-Frequency Digital Controller IC for DC/DC Converters," IEEE Proceedings of the Applied Power Electronics Conference, Mar. 10, 2002, 7 pp., IEEE, Los Alamitos, CA.

Peterchev, A.V., et al., "Quantization Resolution and Limit Cycling in Digitally Controlled PWM Converters," IEEE Transactions on Power Electronics, Jan. 2003, pp. 301-303, vol. 18, No. 1, IEEE, Los Alamitos, CA.

Redl, R., et al., "Optimizing the Load Transient Response of the Buck Converter," Proceedings of the IEEE Applied Power Electronics Conference, 1998, pp. 170-176, IEEE, Los Alamitos, CA.

Schoneman, G.K., et al., "Output Impedance Considerations for Switching Regulators with Current-Injected Control," Proceedings of the 18th Annual IEEE Power Electronics Specialists Conference, Jun. 1987, pp. 324-335, IEEE, Los Alamitos, CA.

Soto, A., et al. "Analysis of the Buck Converter for Scaling the Supply Voltage of Digital Circuits," Proceedings of the IEEE Applied Power Electronics Conference, 2003, pp. 711-717, IEEE, Los Alamitos, CA.

Soto, A., et al., "Design Methodology for Dynamic Voltage Scaling in the Buck Converter," Proceedings of the IEEE Applied Power Electronics Conference, 2005, pp. 263-269, IEEE, Los Alamitos, CA.

Zhou, X., et al., "Improved Light-Load Efficiency for Synchronous Rectifier Voltage Regulation Module," IEEE Transactions on Power Electronics, Sep. 2000, pp. 826-834, vol. 15, No. 5, IEEE, Los Alamitos, CA.

Ludikhuize, A.W., "A Review of RESURF Technology," Proceedings of IEEE ISPSD 2000, May 22, 2000, pp. 11-18.

Feng, P., et al., "Chapter 1: History of the High-Voltage Charge Pump," Charge Pump Circuit Design, McGraw-Hill Electronic Engineering, Jul. 17, 2006, pp. 1-10.

Han, J., "A New Approach to Reducing Output Ripple in Switched-Capacitor-Based Step-Down DC-DC Converters," IEEE Transactions on Power Electronics, vol. 21, No. 6, Nov. 20.

Holtek, "Holtek: HT7660: CMOS Switched-Capacitor Voltage Converter," Nov. 30, 1999, Holtek Semiconductor, Inc., Hsinchu, Taiwan, R,O.C., 9 pages.

LTC Corp., "Linear Technology: LT1054: Switched-Capacitor Voltage Converter with Regulator," 1987, Linear Technology Corporation, Milpitas, CA, 16 pages.

LTC Corp., "Linear Technology: LTC1144: Switched-Capacitor Wide Input Range Voltage Converter with Shutdown," 1994, Linear Technology Corporation, Milpitas, CA, 8 pages.

MA, M., "Design of High Efficiency Step-Down Switched Capacitor DC-DC Converter," Thesis submitted to Oregon State University, May 21, 2003, pp. 1-65.

Maxim, "Maxim: MAX828/MAX829 Switched-Capacitor Voltage Inverters," 19/0495; Rev 3; 9/99, Maxim Integrated Products, Sunnyvale, CA, 8 pages.

Merriam-Webster Online Dictionary, http://www.merriam-webster.com/dictionary/dynamically.

NS, "National Semiconductor: LM2665: Switched Capacitor Voltage Converter," Sep. 2005, National Semiconductor, Santa Clara, CA, 9 pages.

Ti, Inc., "TPS40100: Midrange Input Synchronous Buck Controller with Advanced Sequencing and Output Margining," May 2005, 37 pp., Texas Instruments Incorporated, Dallas, TX.

* cited by examiner

POWER CONVERTER WITH A DYNAMICALLY CONFIGURABLE CONTROLLER AND OUTPUT FILTER

TECHNICAL FIELD

The present invention is directed, in general, to power electronics and, more specifically, to a power converter and method of controlling a power switch therein to regulate an output characteristic of the power converter.

BACKGROUND

A power switch-mode power converter (also referred to as a "power converter" or "regulator") is a power supply or power processing circuit that converts an input voltage waveform into a specified output voltage waveform. DC-DC power converters convert a dc input voltage into a dc output voltage. Controllers associated with the power converters manage an operation thereof by controlling the conduction periods of power switches employed therein. Generally, the controllers are coupled between an input and output of the power converter in a feedback loop configuration (also referred to as a "control loop" or "closed control loop").

Typically, the controller measures an output characteristic (e.g., an output voltage, an output current, or a combination of an output voltage and an output current) of the power converter, and based thereon modifies a duty cycle of the power switches of the power converter. The duty cycle is a ratio represented by a conduction period of a power switch to a power switching period thereof. Thus, if a power switch conducts for half of the power switching period, the duty cycle for the power switch would be 0.5 (or 50%). Additionally, as voltage or current for systems, such as a microprocessor powered by the power converter, dynamically change (e.g., as a computational load on the microprocessor changes), the controller should be configured to dynamically increase or decrease the duty cycle of the power switches therein to maintain an output characteristic such as an output voltage at a desired value.

In an exemplary application, the power converters have the capability to convert an unregulated input voltage supplied by an input voltage source, such as a battery, to a higher or lower, regulated, output voltage that may fall within the range of variability of the input voltage to power a load. For example, the range of the input voltage source may be four to six volts, and the regulated output voltage may be 5 volts. Thus, under one operating condition the power converter boosts the input voltage to produce the output voltage, and under another operating condition the power converter bucks the input voltage to produce the output voltage. To provide the voltage conversion and regulation functions, the power converters include active power switches such as metal-oxide semiconductor field-effect transistors ("MOSFETs") that are coupled to the voltage source and periodically power switch a reactive circuit element such as an inductor to the voltage source at a power switching frequency that may be on the order of five megahertz.

However, a feedback process to control a power switch in a power converter employing a buck power conversion topology produces opposite control signal changes of a comparable feedback process for a power converter employing a boost power conversion topology. In addition, a power converter configured to operate in either a buck or a boost power conversion mode experiences a discontinuity in the control process related to inherent inefficiencies in a practical circuit during transitions between buck and boost power conversion modes. Thus, the problem of controlling a power converter that may be operable in a buck or a boost power conversion mode depending on a relationship between input and output voltages thereof remains an unresolved issue.

Accordingly, what is needed in the art is a controller for a power converter and related method that can operate in different power conversion modes that overcomes deficiencies in the prior art.

SUMMARY OF THE INVENTION

These and other problems are generally solved or circumvented, and technical advantages are generally achieved, by advantageous embodiments of the present invention, including a controller for a power converter and method of controlling a power converter employing different power conversion modes of operation. In one embodiment, the controller includes an error amplifier with first and second input terminals coupled to one of an operating characteristic and a reference voltage of the power converter. The controller also includes a switch configured to couple the first and second input terminals to one of the operating characteristic and the reference voltage as a function of a power conversion mode of the power converter.

In another aspect, the present invention provides an output filter for a power converter including an output filter capacitor with a first terminal coupled to a first output terminal of a power converter. The output filter also includes an output filter inductor coupled between a second terminal of the output filter capacitor and a second output terminal of the power converter.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated, and may not be redescribed in the interest of brevity after the first instance. The FIGURES are drawn to illustrate the relevant aspects of exemplary embodiments.

DETAILED DESCRIPTION OF ILLUSTRATIVE EMBODIMENTS

The making and using of the present exemplary embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a power converter including a controller responsive to a level of an output characteristic relative to an input characteristic to regulate the output characteristic and methods of forming the same. While the principles of the present invention will be described in the environment of a power converter, any application that may benefit from a power converter, such as a power amplifier or a motor controller, including a controller responsive to a level of an output characteristic relative to an input characteristic to regulate the output characteristic is well within the broad scope of the present invention.

Figure 1:
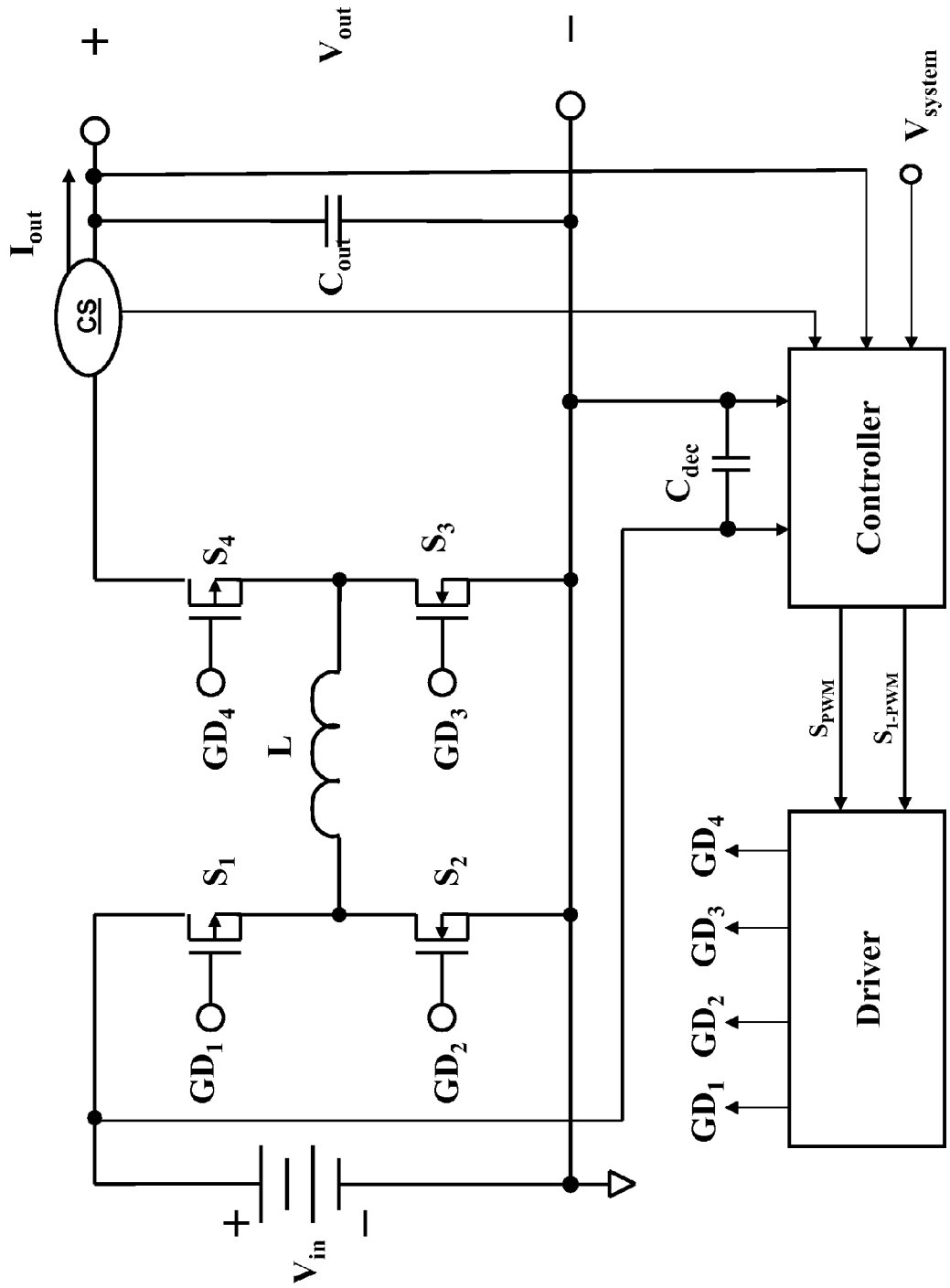
FIG. 1 illustrates a schematic diagram of an embodiment of a power converter constructed according to the principles of the present invention.

Turning now to FIG. 1, illustrated is a schematic diagram of an embodiment of a power converter constructed according to the principles of the present invention. The power converter includes a power train, a controller, and a driver (e.g., a gate driver), and provides power to a system/load such as a microprocessor (not shown) coupled to output terminals. The controller is responsive to an operating characteristic such as a level of an output current $I_{out}$ to regulate an output characteristic of the power converter. While in the illustrated embodiment the power train employs a buck and boost converter topology, those skilled in the art should understand that other converter topologies such as a forward converter topology are well within the broad scope of the present invention.

The power train includes first, second, third and fourth power switches $S_1$, $S_2$, $S_3$, $S_4$ [e.g., an n-channel or p-channel metal oxide semiconductor field effect transistor ("MOSFET") embodied in an n-type or p-type laterally diffused metal oxide semiconductor ("N-LDMOS" or "P-LDMOS") device] and can operate in different power conversion modes such as a buck or boost power conversion mode. The first and second power switches $S_1$, $S_2$ are coupled to an input voltage source that provides an input voltage $V_{in}$ through the an inductor L. In a buck power conversion mode, the third power switch $S_3$ is open and the fourth power switch $S_4$ is closed, while the first and second power switches $S_1$, $S_2$ switch as described herein for the buck mode power conversion mode. Similarly, in a boost power conversion mode, the first power switch $S_1$ is closed, the second power switch $S_2$ is open, while the third and fourth power switches $S_3$, $S_4$ switch as described herein for the boost mode power conversion mode. The power train receives the input voltage $V_{in}$ at an input thereof and provides a regulated output voltage $V_{out}$ at the output terminals or other output characteristic such as the output current $I_{out}$.

Figure 2:
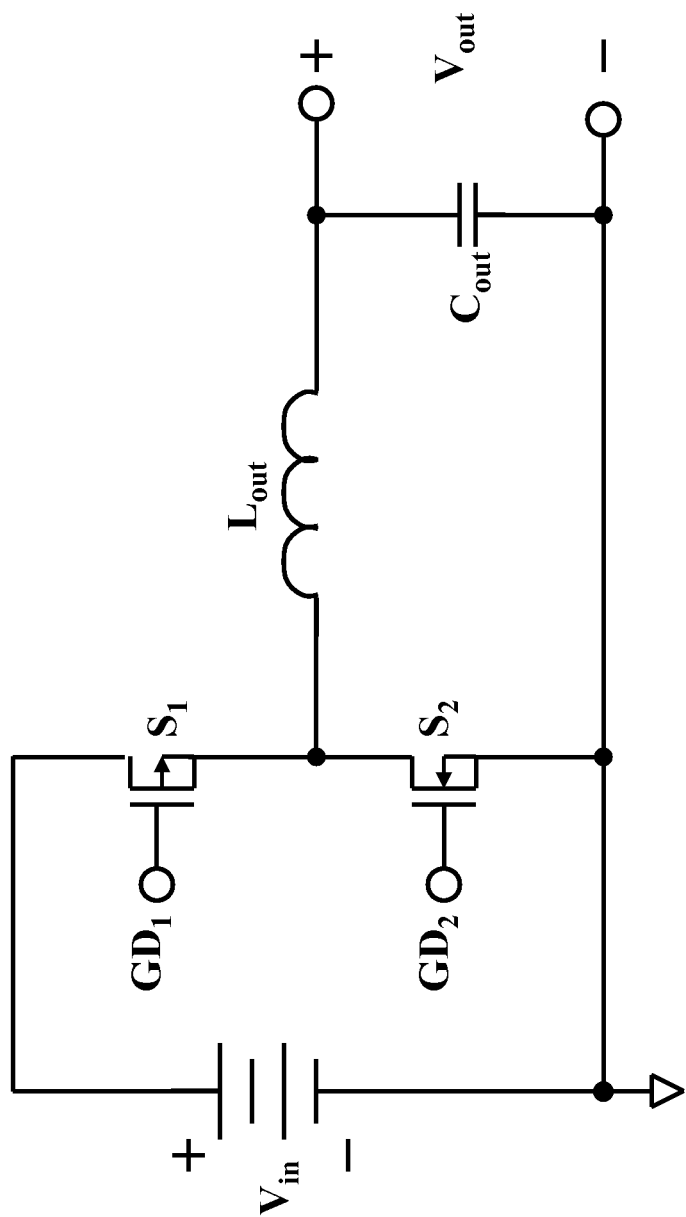
FIGS. 2 and 3 illustrate schematic diagrams of embodiments of a buck power converter topology and a boost power converter topology, respectively, in accordance with the principles of the present invention.
Figure 3:
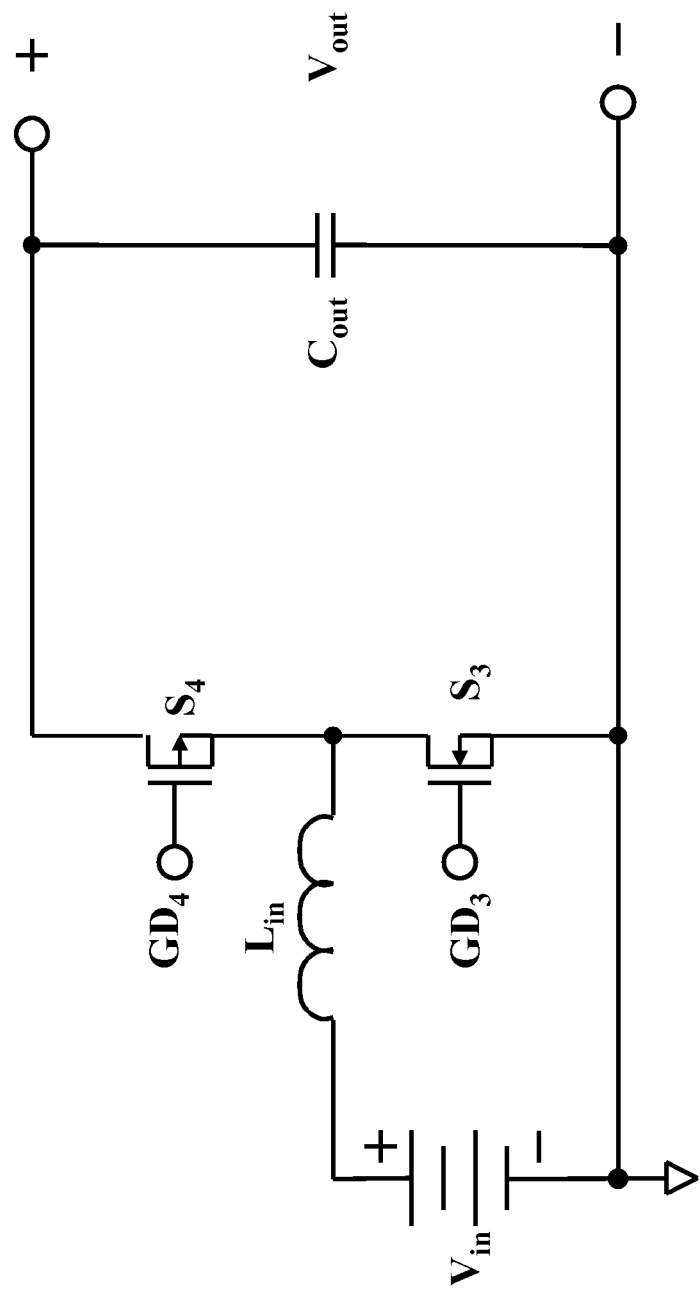

Before continuing with the discussion of the power converter illustrated with respect to FIG. 1, a brief description of embodiments of a buck power converter topology and a boost power converter topology that form a power train of the power converter will be provided in accordance with FIGS. 2 and 3, respectively. Beginning with FIG. 2 and with continuing reference to FIG. 1, illustrated is a schematic diagram of an embodiment of a buck power converter topology including first and second power switches $S_1$, $S_2$ coupled to an input voltage source for providing an input voltage $V_{in}$. The first and second power switches $S_1$, $S_2$ close alternately in response to gate drive signals $GD_1$, $GD_2$, respectively, from a driver with a switching frequency $f_s$. The output voltage $V_{out}$ of a buck power converter topology, which is filtered by an output filter including an output filter inductor $L_{out}$ and an output filter capacitor $C_{out}$ to remove high-frequency components, can be represented approximately with the equation:

$$V_{out} = V_{in} \cdot \delta,$$

wherein $\delta$ is the duty cycle of the first power switch $S_1$ (e.g., the fraction of time that the first power switch $S_1$ is closed or conducting). In order to regulate the output voltage $V_{out}$, an operating characteristic such as a scaled value of the output voltage $V_{out}$ is typically compared against a reference voltage (e.g., a desired system voltage $V_{system}$ from an internal source or from an external source that may be associated with the load) in a controller using an error amplifier. The output of the error amplifier and a sawtooth voltage signal are fed to a comparator associated with a controller. The output of the comparator controls the duty cycle $\delta$. If the output voltage $V_{out}$ is smaller than the desired output voltage, the error amplifier output increases, which increases the duty cycle $\delta$. This forms a negative feedback arrangement to regulate the output voltage $V_{out}$ to a scaled value of the reference voltage. A larger duty cycle implies that the first power switch $S_1$ is closed for a longer fraction of the switching period of the buck power converter topology.

Those skilled in the art should understand that the conduction periods for the first and second power switches $S_1$, $S_2$ may be separated by a small time interval to avoid cross conduction therebetween and beneficially to reduce the power switching losses associated with the power converter. Those skilled in the art should understand further that terms used herein such as "current reversal" or a reference to a particular level of a physical quantity such as "zero current" are to be understood within the context of a physical apparatus with attendant and practical accuracy limitations. For example, one cannot know or measure the precise instant that a current that reverses direction passes through a current level of zero.

Turning now to FIG. 3 and with continuing reference to FIG. 1, illustrated is a schematic diagram of an embodiment of a boost power converter topology including third and fourth power switches $S_3$, $S_4$ coupled to an input voltage source for providing an input voltage $V_{in}$ through input inductor $L_{in}$. The third and fourth power switches $S_3$, $S_4$ close alternately in response to gate drive signals $GD_3$, $GD_4$, respectively, from a driver with a switching frequency $f_s$. The output voltage $V_{out}$ of the boost power converter topology can be represented approximately with the equation:

$$V_{out}=V_{in}/(1-\delta'),$$

where $\delta'$ is the duty cycle of third power switch $S_3$ (e.g., the fraction of time that the third power switch $S_3$ is closed or conducting). In order to regulate the output voltage $V_{out}$, an operating characteristic such as a scaled value of the output voltage $V_{out}$ is compared against a reference voltage (e.g., a desired system voltage $V_{system}$ from an internal source or from an external source that may be associated with the load), again using an error amplifier. The output of the error amplifier and a sawtooth voltage signal are fed to a comparator associated with a controller. The output of the comparator controls the duty cycle $\delta'$. If the output voltage $V_{out}$ is smaller than the desired output, the error amplifier output increases, which in turn increases the duty cycle $\delta'$. Again, a negative feedback loop is formed that regulates the output voltage $V_{out}$. A larger duty cycle implies that the third power switch $S_3$ is closed for a longer fraction of the switching period of the boost power converter topology. As mentioned above, those skilled in the art should understand that the conduction periods for the third and fourth power switches $S_3$, $S_4$ may be separated by a small time interval to avoid cross conduction therebetween and beneficially to reduce the power switching losses associated with the power converter.

It is noted that in the buck power converter topology, the first (upper) power switch $S_1$ (FIG. 2) duty cycle is increased to increase the output voltage $V_{out}$, whereas in the boost power converter topology, the third (lower) power switch $S_3$ (see FIG. 3) duty cycle is increased to increase the output voltage $V_{out}$. Also, the output voltage $V_{out}$ of the buck power converter topology spans the range from 0 to the input voltage $V_{in}$. The output voltage $V_{out}$ of the boost power converter topology spans the non-overlapping voltage range of the input voltage $V_{in}$ to $\infty$. In practice, the maximum output voltage $V_{out}$ is limited, of course, to a finite value.

Returning now to the power converter of FIG. 1, the controller is coupled to and regulates the output voltage $V_{out}$ (or other output characteristic) at a constant desired level independent of the input voltage $V_{in}$. The controller of the power converter receives the output characteristic (e.g., the output current $I_{out}$ and/or the output voltage $V_{out}$) of the power converter, and a desired output characteristic such as a desired system voltage $V_{system}$ from an internal source or from an external source that may be associated with the load. The output characteristic is coupled to one input of an error amplifier in the controller and a reference voltage such as the desired system voltage $V_{system}$ is coupled to the other input of the error amplifier. In an advantageous embodiment, the controller may be coupled to a sensor, such as current sensor CS to sense an operating characteristic such as a power converter current (e.g., the output current $I_{out}$). In a further advantageous embodiment, the controller may be coupled to a current sensor to sense a current in a power switch.

The controller may also be coupled to an input characteristic (e.g., the input voltage $V_{in}$) of the power converter and to a return lead of the source of electrical power as illustrated in FIG. 1 to provide a ground connection therefor. While only a single ground connection is illustrated in the present embodiment, those skilled in the art should understand that multiple ground connections may be employed for use within the controller. A decoupling capacitor $C_{dec}$ may be coupled as illustrated in the FIGURE to the path from the input voltage $V_{in}$ to the controller. The decoupling capacitor $C_{dec}$ is generally configured to absorb high frequency noise signals associated with the switching of electrical power from corrupting the controller.

In accordance with the aforementioned characteristics, the controller provides a signal (e.g., a pulse-width modulated signal $S_{PWM}$) to control a duty cycle and a frequency of the power switches $S_1$, $S_2$, $S_3$, $S_4$, of the power train to regulate the output voltage $V_{out}$ or other output characteristic thereof The controller in some applications may also provide a complement of the pulse-width modulated signal $S_{PWM}$ (e.g., a complementary pulse-width modulated signal $S_{1-PWM}$) in accordance with the aforementioned characteristics. Any controller adapted to control at least one power switch of the power converter is well within the broad scope of the present invention. As an example, a controller employing digital circuitry is disclosed in U.S. Pat. No. 7,038,438, entitled "Controller for a Power Converter and a Method of Controlling a Power switch Thereof," to Dwarakanath, et al., issued, May 2, 2006, and U.S. Pat. No. 7,019,505, entitled "Digital Controller for a Power Converter Employing Selectable Phases of a Clock Signal," issued, Mar. 28, 2006, which are incorporated herein by reference.

The power converter also includes the driver (e.g., a gate driver) to provide the gate drive signals $GD_1$, $GD_2$, $GD_3$, $GD_4$ to control conductivity of the first, second, third and fourth power switches $S_1$, $S_2$, $S_3$, $S_4$, respectively, responsive to the pulse-width modulated signal $S_{PWM}$ (and, if necessary, the control the complementary pulse-width modulated signal $S_{1-PWM}$) provided by the controller. There are a number of viable alternatives to implement a driver that include techniques to provide sufficient signal delays to prevent crosscurrents when controlling multiple power switches in the power converter. The driver typically includes power-switching circuitry incorporating a plurality of driver power switches that cooperate to provide the drive signals $GD_1$, $GD_2$, $GD_3$, $GD_4$ to the first, second, third and fourth power switches $S_1$, $S_2$, $S_3$, $S_4$. Of course, any driver capable of providing the drive signals to control a power switch is well within the broad scope of the present invention. As an example, a driver is disclosed in U.S. Pat. No. 7,330,017, entitled "Driver for a Power Converter and a Method of Driving a Power switch Thereof," issued Feb. 12, 2008, and a power switch is disclosed in U.S. Pat. No. 7,230,302, entitled "Laterally Diffused Metal Oxide Semiconductor Device and Method of Forming the Same," issued Jun. 12, 2007 and in U.S. Pat. No. 7,214,985, entitled "Integrated Circuit Incorporating Higher Voltage Devices and Low Voltage Devices Therein," issued May 8, 2007, which are incorporated herein by reference.

According to the principles of the present invention, the power switches $S_1$, $S_2$, $S_3$, $S_4$ are typically power switches that can be incorporated into a semiconductor device in an integrated circuit proximate control or signal processing devices that perform many of the control functions of the controller of the power converter. The control and signal processing devices are typically complementary metal-oxide semiconductor ("CMOS") devices that may be p-type metal oxide semiconductor ("PMOS") devices or n-type metal oxide semiconductor ("NMOS") devices. The PMOS and NMOS devices may also be referred to as p-channel and n-channel MOSFETs, respectively.

As mentioned above, the controller typically regulates an output characteristic of a power converter by controlling a duty cycle of a power switch. Duty cycle is generally controlled as described previously hereinabove by comparing a sawtooth voltage waveform with a controlled threshold voltage produced by an error amplifier configured to sense an operating characteristic such as an output voltage or other output characteristic. To regulate an output characteristic such as an output voltage of a power converter, an error amplifier is included in a power converter feedback loop. An error amplifier is frequently constructed with a feedback path having a number of capacitors and resistors coupled between operational amplifier inputs and outputs to provide a frequency-dependent error amplifier gain.

Regarding the operation of the power converter, the input voltage $V_{in}$ may be less than the output voltage $V_{out}$ in a boost power conversion mode, or greater than the output voltage $V_{out}$ in a buck power conversion mode, and the input voltage $V_{in}$ may transition from one such level to another, such as when a battery is charged or discharged under a load. Under all these conditions the output voltage $V_{out}$ should remain well regulated and stable. The controller may be implemented as a purely analog circuit, a purely digital circuit, or as a hybrid combination of an analog and a digital circuit. The controller should not only provide negative feedback to regulate the output voltage $V_{out}$, it should also be stable under all operating conditions of the input voltage $V_{in}$ relative to the output voltage $V_{out}$.

In a typical analog feedback control loop, an operating characteristic such as a scaled value of the output voltage $V_{out}$ is compared against a reference voltage representing, for instance, a desired output voltage of the power converter in the error amplifier. The error amplifier may integrate the difference in the input voltages thereto to produce the result at the error amplifier output. In a steady state, the inputs to the error amplifier are equal, and the output of the error amplifier reaches a steady-state value (e.g., a dc level). The output of the error amplifier and a sawtooth signal are coupled to inputs of a comparator associated with the controller. The comparator produces a rectangular waveform (e.g., a pulse-width modulated ("PWM") output).

In a buck power conversion mode, the output of the error amplifier rises when the scaled value of the output voltage $V_{out}$ is less than the reference voltage. As the output of the error amplifier voltage increases, the duty cycle of the rectangular waveform (i.e., output of the comparator) increases, which causes the output voltage $V_{out}$ to rise, bringing the scaled value of the output voltage closer to the reference voltage. Finally, in a steady-state, the output of the error amplifier, the comparator, and the power converter output voltage $V_{out}$ all reach steady, dc values.

When the input voltage $V_{in}$ is substantially greater than the output voltage $V_{out}$, the output of the error amplifier will be relatively low, and the duty cycle small. As the input voltage $V_{in}$ is reduced, the error amplifier output rises, increasing the duty cycle to maintain the output voltage $V_{out}$ at the desired level. As the input voltage $V_{in}$ approaches the output voltage $V_{out}$, the duty cycle approaches 100%. When the duty cycle becomes 100%, the output voltage $V_{out}$ is slightly lower than the input voltage $V_{in}$, as indicated by the equation:

$$V_{out}=V_{in}-IR,$$

where I is the load current and R is the dc on-resistance of the first power switch $S_1$ plus all other parasitic resistances in the current path. In the power converter illustrated herein, R is the sum of the dc on resistances of the first and fourth power switches $S_1$, $S_4$ plus the other parasitic resistances in the power converter. As introduced herein, as the input voltage $V_{in}$ approaches:

$$V_{out}+IR.$$

the operation of the power converter is switched from the buck power conversion mode to the boost power conversion mode.

When the input voltage $V_{in}$ is equal to:

$$V_{in}=V_{out}+IR,$$

the error amplifier output is equal to the peak of the sawtooth waveform coupled to its input, and duty cycle of first power switch $S_1$ is substantially 100%. At this point, the controller switches the power converter to a boost power conversion mode. In the boost power conversion mode, the first power switch $S_1$ is continuously on, the second power switch $S_2$ is continuously off, and the power switching operation of the third and fourth power switches $S_3$, $S_4$ is initiated. When the input voltage $V_{in}$ is slightly less than the output voltage $V_{out}+I$ R, the third power switch $S_3$ is turned on with a very small duty cycle, and the fourth power switch $S_4$ is turned on with the complementary duty cycle. Preferably, the output of the error amplifier falls below the peak value of the sawtooth input waveform to the error amplifier. If the output of the error amplifier did not decrease as the input voltage $V_{in}$ decreases, the output would decrease in the boost power conversion mode and drive the output of the error amplifier even higher, resulting in a saturated operating condition. To reverse the output of the error amplifier and prevent saturation thereof, the inputs to the error amplifier are reversed. However, an error amplifier is ordinarily operative as an integrator, which prevents a straightforward reversal of the inputs thereto.

Figure 4:
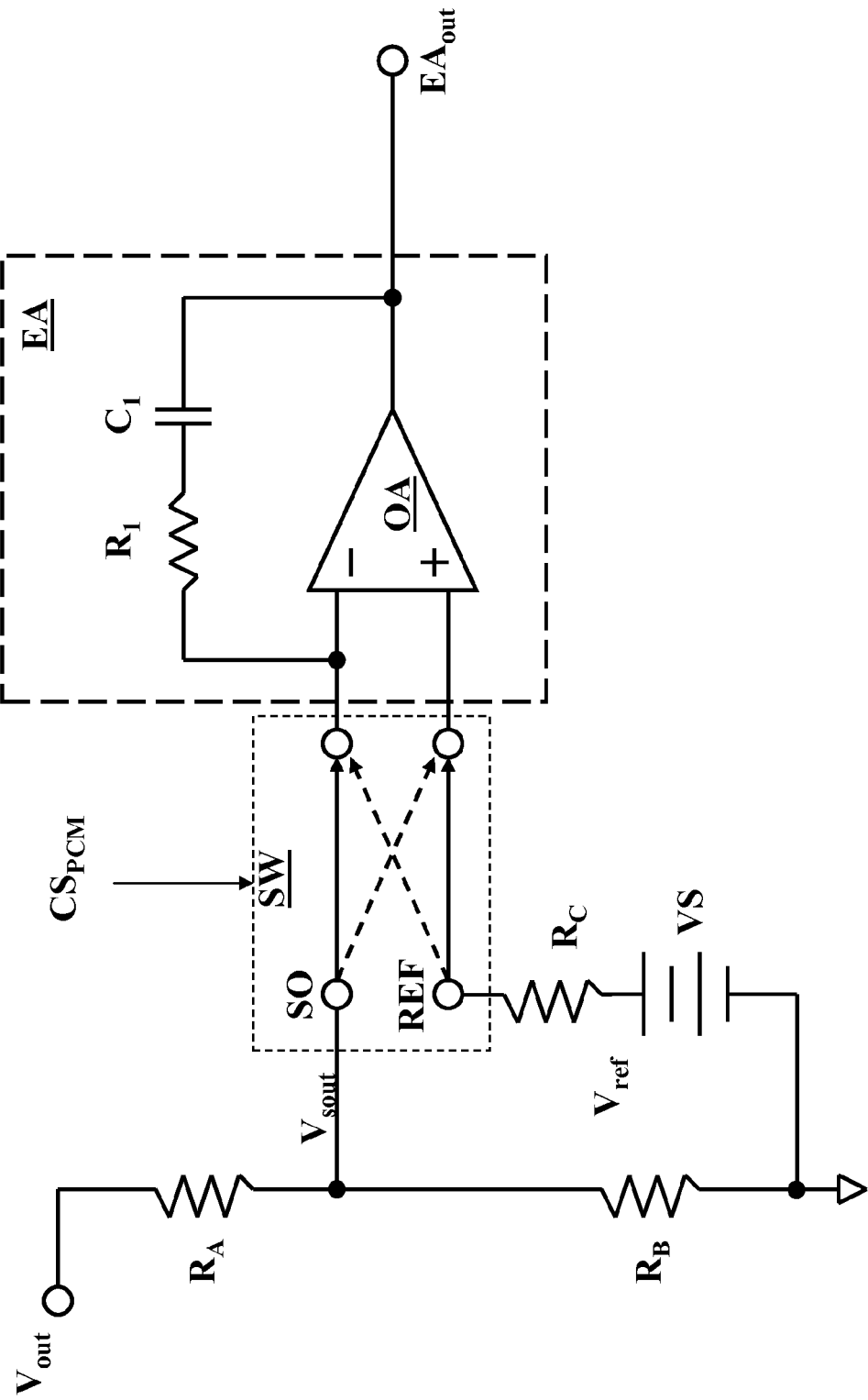
FIGS. 4 to 6 illustrate schematic diagrams of embodiments of portions of a controller constructed according to the principles of the present invention.
Figure 5:
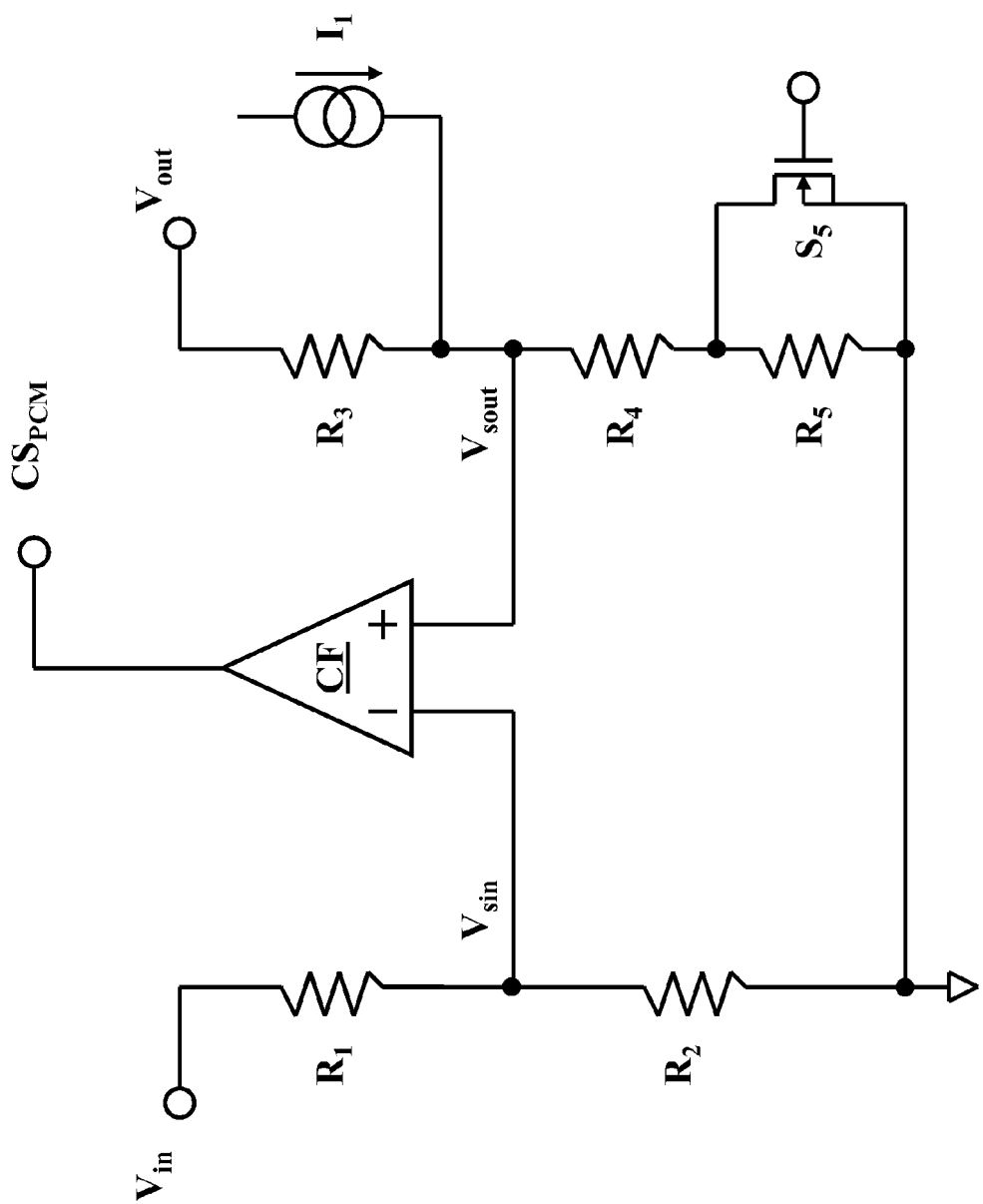
Figure 6:
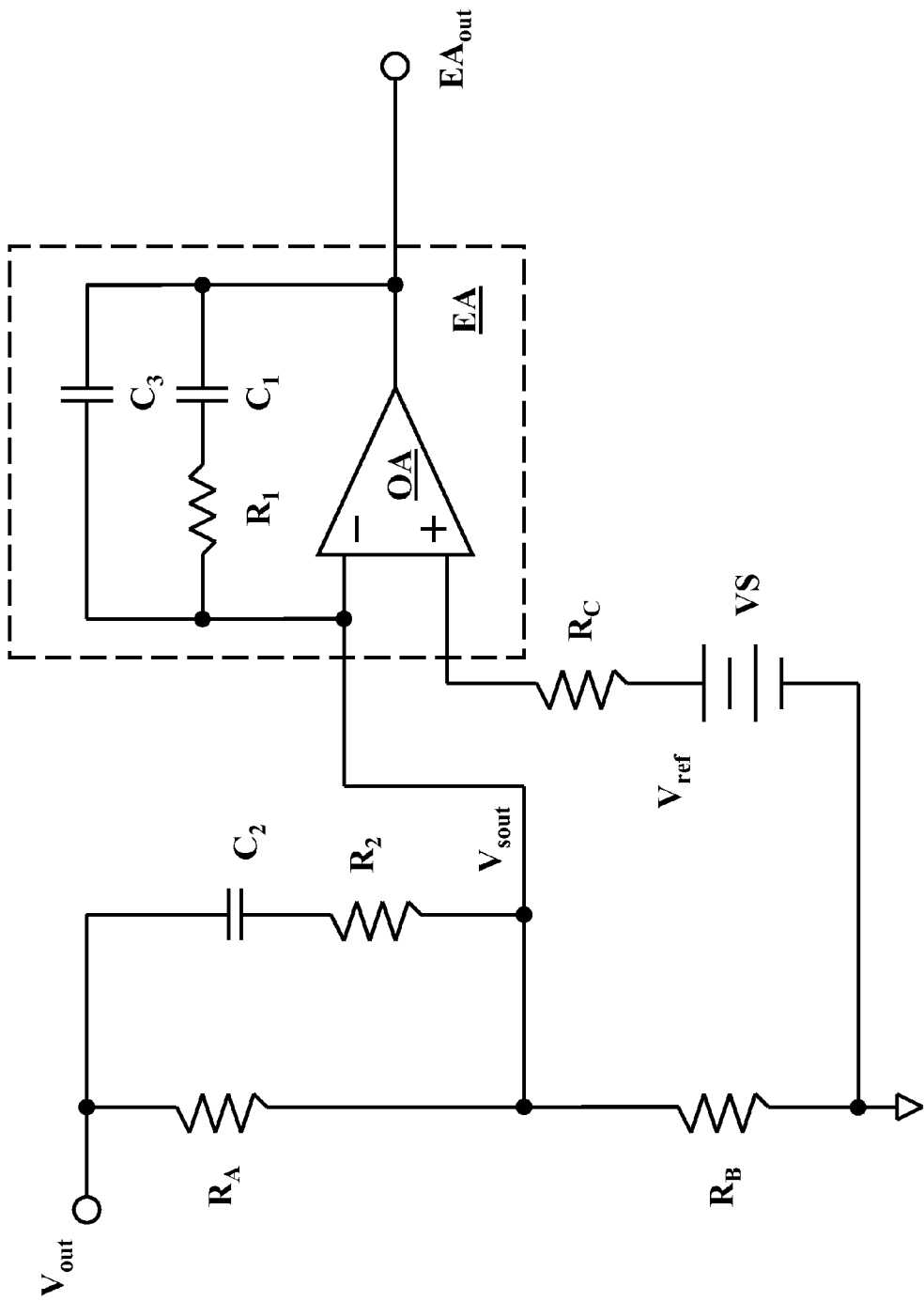

Turning now to FIGS. 4 to 6, illustrated are schematic diagrams of embodiments of portions of a controller constructed according to the principles of the present invention. Beginning with FIG. 4, an operating characteristic such as a scaled value $V_{sout}$ of the output voltage $V_{out}$ (in accordance with first and second scaling resistors $R_A$, $R_B$) is coupled to a node SO. A resistor $R_C$ is coupled in series with a voltage source VS to produce a reference voltage $V_{ref}$, which is provided to a node REF. The addition of the resistor $R_C$ produces a non-zero integration time constant in an error amplifier EA. Preferably, the resistance of the resistor $R_C$ is equal to that of the parallel combination of the first and second scaling resistors $R_A$, $R_B$.

In a buck power conversion mode of operation, the circuit nodes SO, REF are connected via a switch (e.g., a two pole, double throw switch) SW in accordance with a power conversion mode control signal $CS_{PCM}$ to negative (or inverting) and positive (or non-inverting) input terminals, respectively, of an operational amplifier OA of the error amplifier EA that produces an error amplifier output $EA_{out}$ at an output terminal thereof. Thus, if the output voltage $V_{out}$ is lower than the desired value, the node SO is more negative relative to the node REF and the error amplifier output $EA_{out}$ integrates up, turning on the first power switch $S_1$ (see FIG. 1) for a longer period, thereby increasing the output voltage $V_{out}$. If the output voltage $V_{out}$ is higher than a desired level, the opposite effect happens, as required in a negative feedback process.

In a boost power conversion mode of operation, the circuit nodes SO, REF are connected via the switch SW in accordance with a power conversion mode control signal $CS_{PCM}$ to positive and negative input terminals, respectively, of the operational amplifier OA of the error amplifier EA that produces the error amplifier output $EA_{out}$ at an output terminal thereof. If the output voltage $V_{out}$ is lower than the desired value, the node SO is more negative relative to the node REF, and the error amplifier output $EA_{out}$ integrates down, turning on the third power switch $S_3$ (see FIG. 1) for a longer period, thereby increasing the output voltage $V_{out}$. If the output voltage $V_{out}$ is higher than a desired level, the opposite happens, again as required in a negative feedback process. It should be noted that the error amplifier EA is constructed with the feedback path including a feedback resistor $R_1$ and a feedback capacitor $C_1$ to form an integrating structure for the error amplifier EA. Thus, the switch SW selects a coupling of the first and second input terminals [e.g., the positive (or non-inverting) and negative (or inverting) input terminals] to one of the operating characteristic (e.g., scaled value $V_{sout}$ of the output voltage $V_{out}$) and the reference voltage $V_{ref}$ as a function of a power conversion mode of the power converter.

Turning now to FIG. 5, illustrated is a comparator CF configured to produce a power conversion mode control signal $CS_{PCM}$ to select a power conversion mode for a power converter in accordance with the principles of the present invention. To select the power conversion mode, an operating characteristic such as a scaled value $V_{sin}$ of an input voltage $V_{in}$ produced by a resistor divider network formed with first and second input scaling resistor $R_1$, $R_2$, is compared to an operating characteristic such as a scaled value $V_{sout}$ of an output voltage $V_{out}$ produced by a resistor divider network formed with third, fourth and fifth output scaling resistor $R_3$, $R_4$, $R_5$. If the scaled input voltage $V_{sin}$ is higher than the scaled output voltage $V_{sout}$, the power converter is placed in a buck power conversion mode of operation. If the scaled output voltage $V_{sout}$ is greater than the scaled input voltage $V_{sin}$, the power converter is placed in a boost power conversion mode of operation, as described further below.

An uncertainty in the level at which to switch is created due to I·R voltage drops across the first and fourth power switches $S_1$, $S_4$ (see FIG. 1). Power switching from a buck power conversion mode of operation to a boost power conversion mode of operation preferably occurs when:

$$V_{in} = V_{out} + IR.$$

The power-switching threshold is now a function of a load or output current. A load current may be sensed by measuring the voltage drop across either the first power switch $S_1$ or the fourth power switch $S_4$ when the particular power switch is not switching. Alternatively, the load current can be known a priori in a particular application such as in a light-emitting diode ("LED") driver. In the case of an LED driver, the load current is set by a current digital-to-analog converter. This information can be employed to set the power-switching threshold.

The following relationships provide the needed switching function between power conversion operational modes: The fifth output scaling resistor $R_5$ is included for hysteresis, which is initially assumed to be 0 and which may be provided, without limitation, by coupling the gate of a switch $S_5$ to the power conversion mode control signal. The switching threshold is given by the equation:

$$[R_2/(R_1+R_2)]V_{in} = [R_4/(R_3+R_4)](V_{out}),$$

which can be rewritten to include a threshold correction component dependent on a current $I_1$, $$V_{in} = [(R_1+R_2)/R_2](R_4/R_3+R_4)(V_{out}+I_1 R_3).$$

If $R_1 = R_3$ and $R_2 = R_4$, then the equation above simplifies to:

$$V_{in} = V_{out} + I_1 R_3.$$

If the threshold correction component $I_1 \cdot R_3$ is set equal to $I_{LOAD} \cdot R_{switches}$, where $I_{LOAD}$ is a load current of the power converter, a smooth transition for the power conversion modes of operation can be achieved. Typically, the on resistances $R_{switches}$ of the power switches are small and the load current $I_{LOAD}$ is large. However, the resistance of the third output scaling resistor $R_3$ will be large and the current $I_1$ provided by a current source will be small. Thus, no significant added power consumption is introduced in the power converter by a current $I_1$ from the current source. The fifth output scaling resistor $R_5$ is a small-value resistor that operates in conjunction with the switch $S_5$ to provide hysteresis against chatter in selection of the power conversion mode of operation.

Turning now to FIG. 6, illustrated is a schematic diagram of an error amplifier EA formed with a type 3 compensation circuit in accordance with the principles of the present invention. A type 3 compensation circuit, which provides three poles and two zeros in its response, may be used for voltage mode control of a power converter because of the design flexibility provided by the multiple poles and zeros. A type 3 compensation circuit with an ideal operational amplifier (i.e., an operational amplifier with infinite linear gain and bandwidth) has a pole at the origin of the complex frequency plane (i.e., it is operative as an integrator) produced by first and second feedback capacitors $C_1$, $C_3$ in conjunction with first and second scaling resistors $R_A$, $R_B$, and by another scaling resistor $R_2$ and a scaling capacitor $C_2$, that ensures high dc gain and low output-voltage dc error. Additionally, a pair of zeros (e.g., one provided by the feedback resistor $R_1$ and the feedback capacitor $C_1$, and one provided by the first scaling resistor $R_A$, the another scaling resistor $R_2$, and the scaling capacitor $C_2$) provides a desired phase boost near a power converter resonant frequency, thereby providing increased feedback loop bandwidth. Another pair of poles, provided by the feedback resistor $R_1$, the another scaling resister $R_2$, the first and second feedback capacitors $C_1$, $C_3$ and the scaling capacitor $C_2$, sets a desired high-frequency gain margin. These poles and zeros are produced during a buck power conversion mode wherein a scaled value $V_{sout}$ of the output voltage $V_{out}$ is connected to a negative terminal of an error amplifier EA and a reference voltage $V_{ref}$ is connected to a positive terminal of the error amplifier EA.

Figure 7:
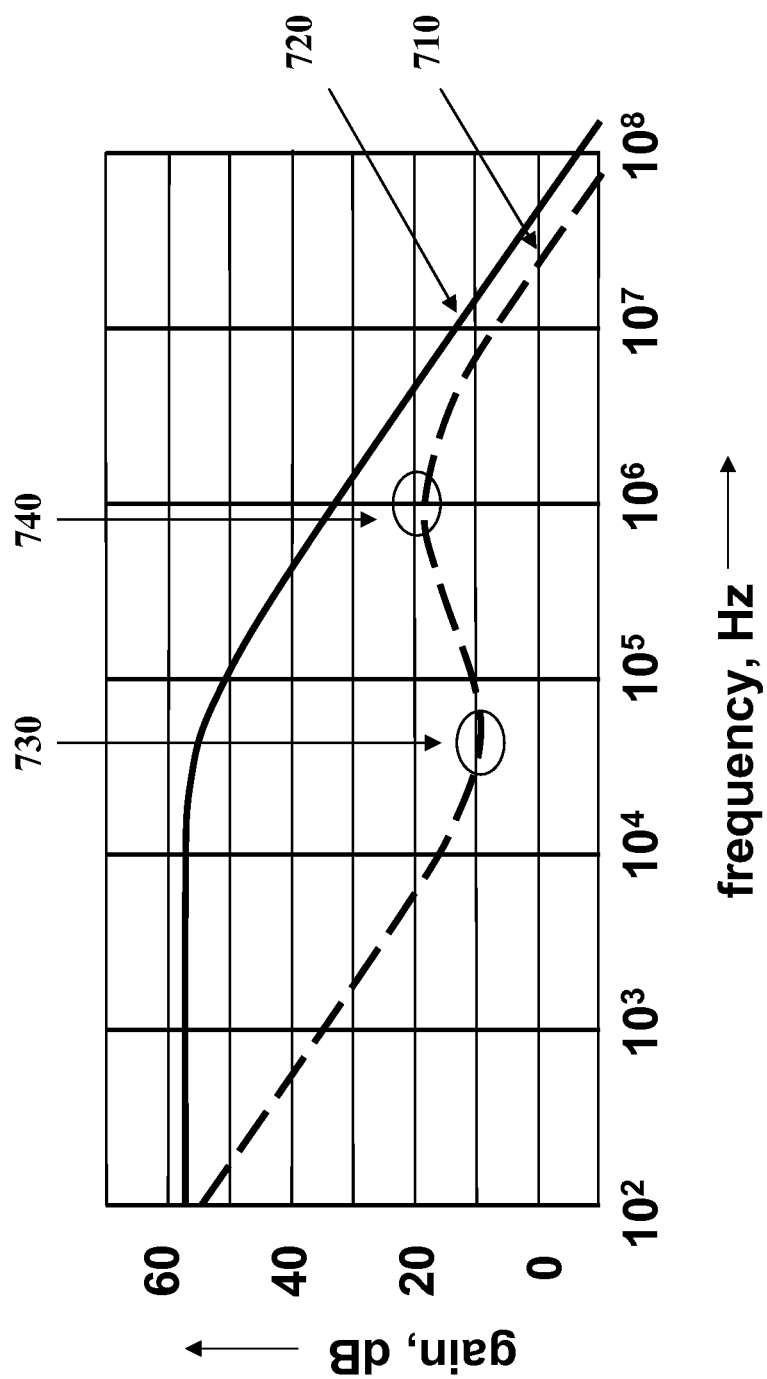
FIGS. 7 to 9 illustrate graphical diagrams demonstrating exemplary operational gains of a power converter in accordance with the principles of the present invention.
Figure 8:
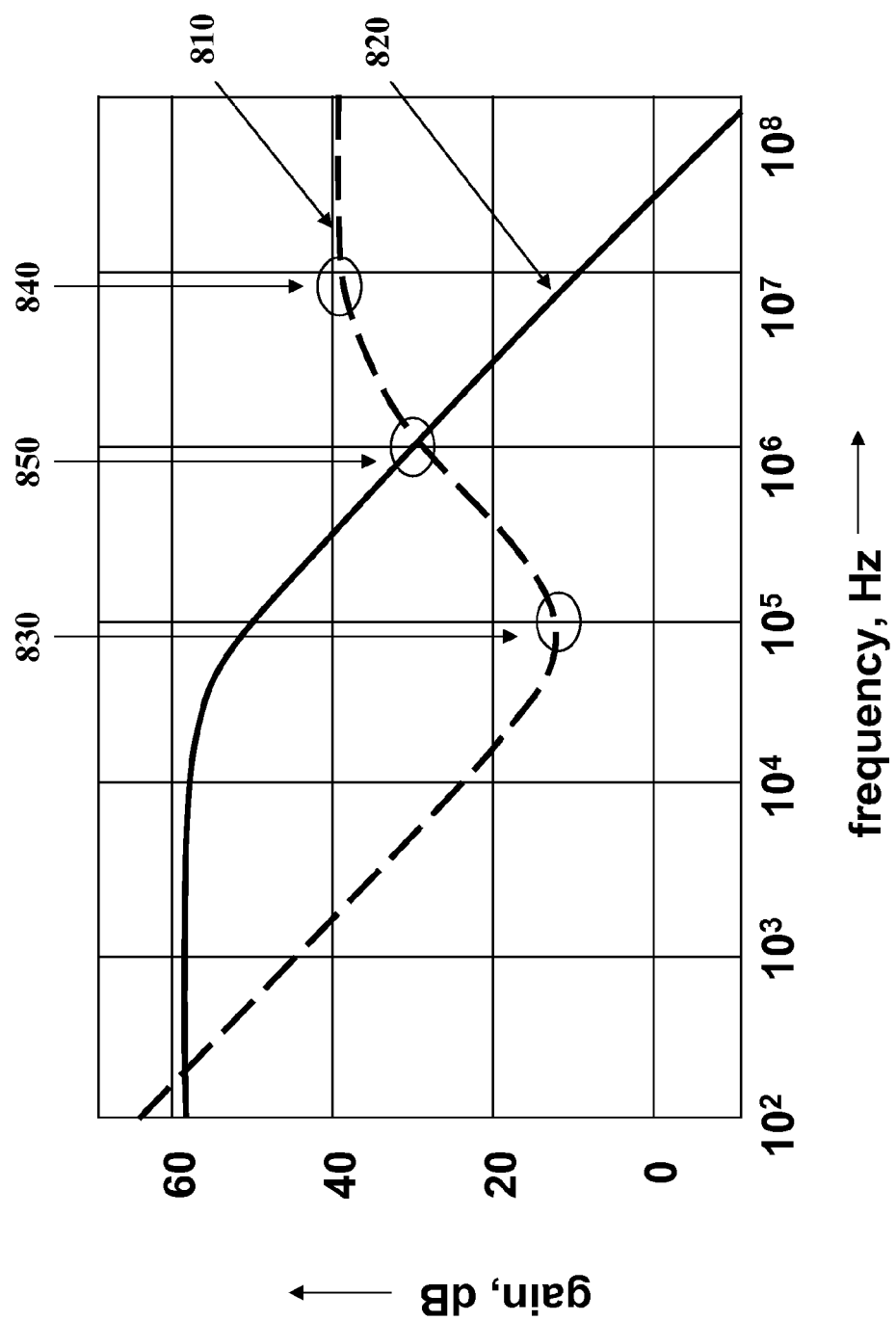
Figure 9:
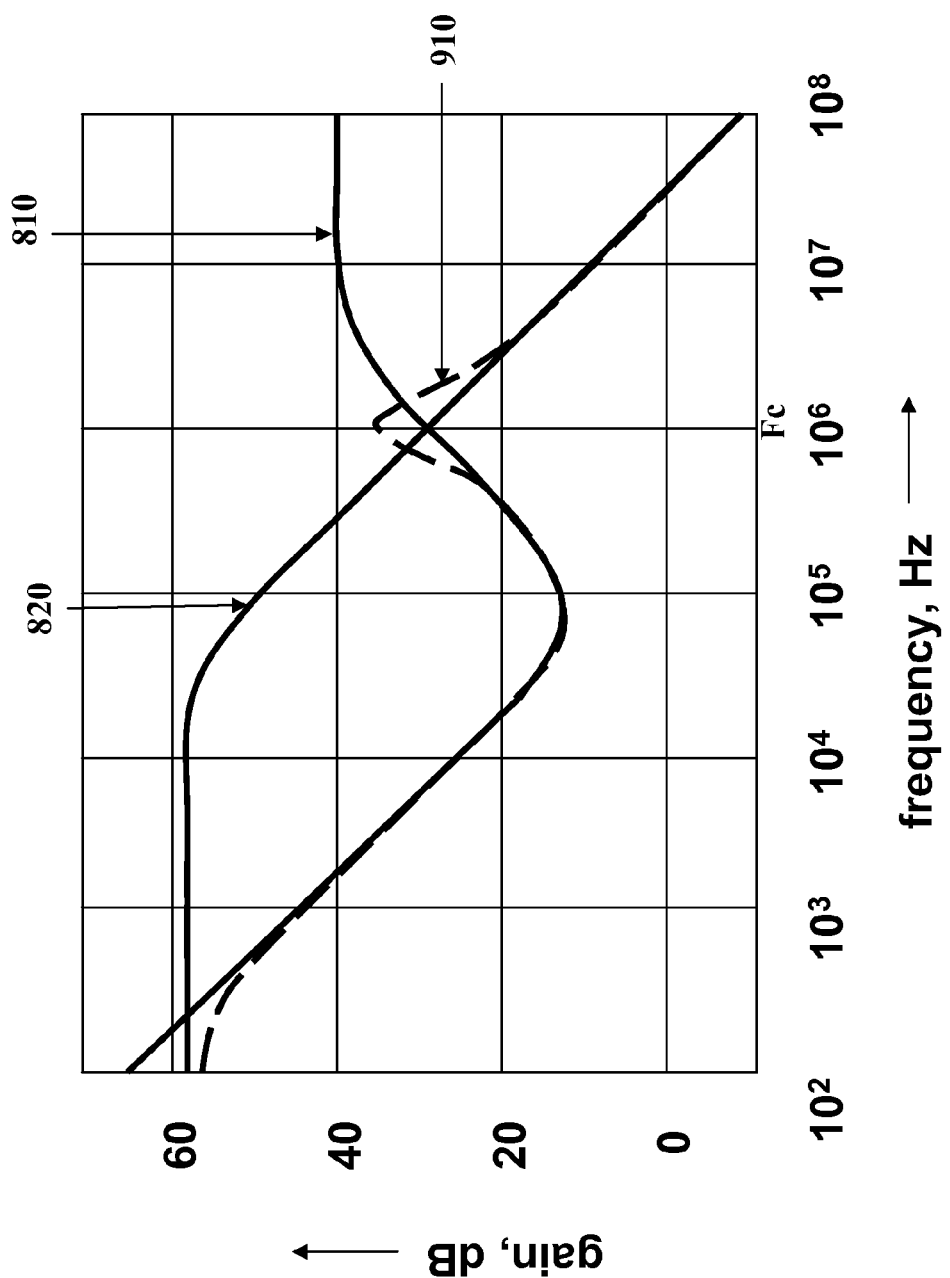

Turning now to FIGS. 7 to 9, illustrated are graphical diagrams demonstrating exemplary operational gains of a power converter in accordance with the principles of the present invention. Beginning with FIG. 7, illustrated is a graphical diagram demonstrating a type 3 compensation gain 710 of a compensation circuit with an ideal error amplifier in a buck power conversion mode of operation and a gain limit 720 of an operational amplifier. As illustrated herein, the compensation gain 710 exhibits two zeros 730 and two poles 740. A further pole is produced at the origin of the complex frequency plane. At higher frequencies, the compensation gain 710 of the compensation circuit does not intersect the gain limit 720 of the operational amplifier.

Turning now to FIG. 8, illustrated is a graphical diagram demonstrating a compensation gain 810 of a compensation circuit with an ideal error amplifier in a boost power conversion mode of operation and the gain limit 820 of an operational amplifier. As illustrated herein, the compensation gain 810 exhibits two zeros 830 and one pole 840. Again, a further pole (e.g., a double pole) is produced at the origin of the complex plane. This occurs because in the boost power conversion mode, the resistor divider network formed by the first, second and another scaling resistors $R_A$, $R_B$, $R_2$ and second scaling capacitor $C_2$ is coupled to the positive (or non-inverting) input terminal of the operational amplifier OA as discussed in FIGS. 4 to 6, which eliminates the third pole. Accordingly, the compensation gain 810 goes beyond the gain limit 820 of the operational amplifier. As a result, the poles and zeros described above with reference to FIG. 8 are not produced, resulting in a different error amplifier gain behavior as illustrated in FIG. 9. This occurs because in the boost power conversion mode, the resistor divider network formed by the scaling resistors $R_A$, $R_B$, $R_2$ and scaling capacitor $C_2$ is coupled to the positive input terminal of the operational amplifier OA, which eliminates their frequency-dependent effects on the response of the error amplifier EA. In the boost power conversion mode, the new error amplifier gain 910 as illustrated in FIG. 9 can produce a stability problem for the power converter, especially with the use of ceramic output capacitors for the output filter capacitor $C_{out}$ as introduced herein.

Turning now to FIG. 9, illustrated is a graphical diagram demonstrating the error amplifier gain 910 wherein the operational amplifier gain limit 820 intersects the error amplifier compensation gain 810. In the boost power conversion mode, the compensation gain 810 extends beyond the internal bandwidth limit of the error amplifier, which contributes directly to the gain and the phase of the compensation circuit as illustrated herein. The equivalent gain 910 of the error amplifier initiates a sharp phase lag at a frequency about half a decade below the intersection frequency Fc of the operational amplifier gain limit 820 with the compensation gain 810. The sharp phase lag adversely affects the stability of the power converter in the boost power conversion mode. A preferred way to avoid the sharp phase lag as introduced herein is to generate two zeros located at or below the intersection frequency Fc to cancel this effect.

Two added zeros are advantageously produced in an embodiment by coupling an output filter inductor in series with a capacitor forming an output filter capacitor of the power converter. A capacitor such as a ceramic capacitor has a self-resonant frequency ("SRF"), and at this frequency the capacitor generates a pair of complex zeros. For example, a 10 or 20 microfarad ("µF") ceramic capacitor exhibits an SRF typically in the range of 700-1500 kilohertz ("kHz"). Coupling an output filter inductor in series with the output capacitor of the power converter shifts down the location of the SRF to enable the location of the pair of complex zeros to be at a frequency Fc, or at a lower frequency if desired.

Figure 10:
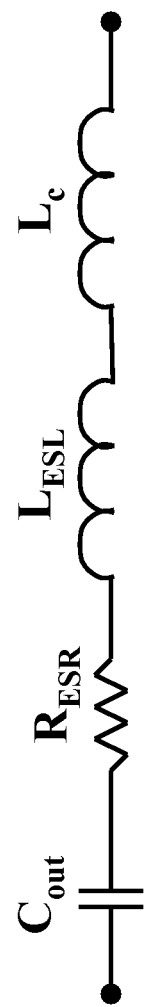
FIG. 10 illustrates a schematic diagram of an embodiment of an output filter constructed according to the principles of the present invention.

Turning now to FIG. 10, illustrated is a schematic diagram of an embodiment of an output filter constructed according to the principles of the present invention. The output filter includes an output filter capacitor $C_{out}$ (e.g., a ceramic capacitor) with a series-coupled output filter inductor $L_c$. A resistor $R_{ESR}$ and an inductor $L_{ESL}$ represent, respectively, the equivalent series resistance and equivalent series inductance of the output filter capacitor $C_{out}$. The equation below illustrates calculation of the inductance of the output filter inductor $L_c$ for a desired intersection frequency Fc.

$$L_C = \frac{(Fc \cdot 2\pi)^2}{C_{out}} - L_{ESL}$$

Figure 11:
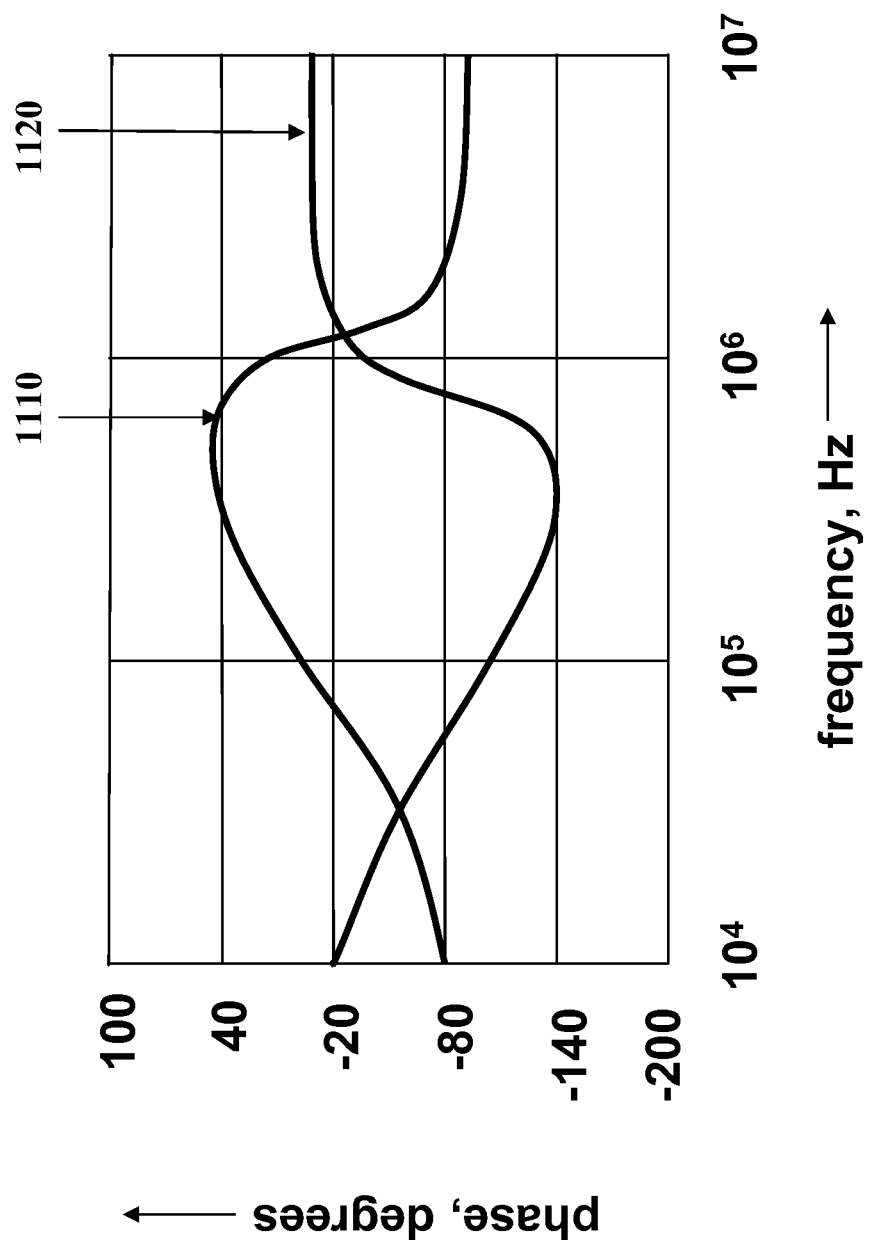
FIG. 11 illustrates a graphical diagram demonstrating an exemplary phase of an error amplifier during a boost power conversion mode of operation of a power converter, and an exemplary phase of an output filter capacitor in accordance with the principles of the present invention.

Turning now to FIG. 11, illustrated is a graphical diagram demonstrating an exemplary phase 1110 of an error amplifier during a boost power conversion mode of operation of a power converter, and an exemplary phase 1120 of an output filter capacitor in accordance with the principles of the present invention. Using the equation above to select an inductance of the output filter inductor enables the pair of complex zeros to cancel the effect of the sharp phase lag generated by the error amplifier as illustrated herein, resulting in a stable control response for the power converter. The added output filter inductor does not contribute significantly to the output impedance of the power converter.

Figure 12:
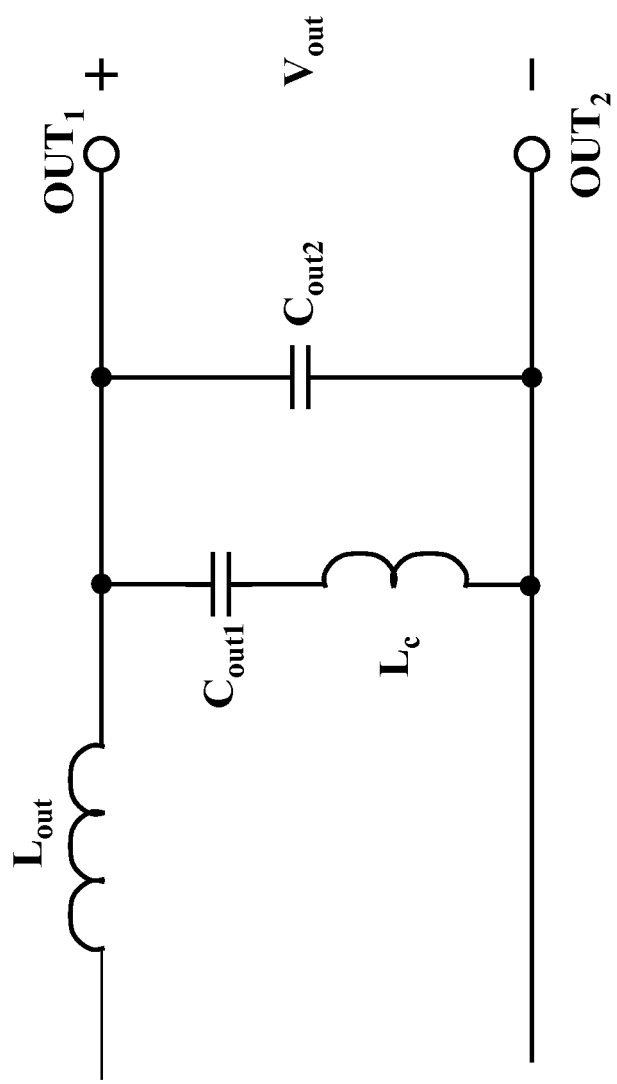
FIG. 12 illustrates a schematic diagram of an embodiment of an output filter constructed according to the principles of the present invention.

Turning now to FIG. 12, illustrated is a schematic diagram of an embodiment of an output filter constructed according to the principles of the present invention. The output filter includes an output filter capacitor $C_{out1}$ with a first terminal coupled to a first output terminal $OUT_1$ of a power converter and an output filter inductor $L_c$ coupled between a second terminal of the output filter capacitor $C_{out1}$ and a second output terminal $OUT_2$ of the power converter. The output filter also includes another output filter inductor $L_{out}$ coupled to the first terminal of the output filter capacitor $C_{out1}$. The output filter still further includes another output filter capacitor $C_{out2}$, such as a small ceramic capacitor, coupled in parallel to the output filter capacitor $C_{out1}$ and the output filter inductor $L_c$ to provide a low impedance bypass for high frequency ripple components at the first and second output terminals $OUT_1$, $OUT_2$ of the power converter.

Thus, as introduced herein, inputs to an error amplifier are reversed, dependent on an output characteristic thereof, such as an output voltage, to switch between power conversion modes of operation such as a buck power conversion mode and a boost power conversion mode when an input voltage of a power converter crosses a threshold level. A resistor is coupled in series with a reference voltage to enable an error amplifier to operate with reversed inputs. A known load current, such as a current produced by an LED driver, may be employed to set a power-switching threshold for reversing the inputs to the error amplifier. An inductor may be coupled in series with an output capacitor to stabilize a feedback control loop.

Those skilled in the art should understand that the previously described embodiments of a power converter and related methods of constructing the same are submitted for illustrative purposes only. In addition, other embodiments capable of producing a power converter employable with other power switch-mode power converter topologies are well within the broad scope of the present invention. While the power converter has been described in the environment of a power converter including a controller to control an output characteristic to power a load, the power converter including a controller may also be applied to other systems such as a power amplifier, a motor controller, and a system to control an actuator in accordance with a stepper motor or other electromechanical device.

For a better understanding of power converters, see "Modern DC-to-DC Power switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system, comprising:
    an output filter capacitor with a first terminal directly coupled to a first output terminal of a power converter;
    an output filter inductor, directly coupled between a second terminal of said output filter capacitor and a second output terminal of said power converter, selected to stabilize a feedback control loop of said power converter in combination with said output filter capacitor;
    another output filter capacitor directly coupled to said first and second output terminals, and coupled directly in parallel to said output filter capacitor and said output filter inductor, wherein said first and second output terminals of said power converter are load terminals capable of sustaining a direct current ("dc") output characteristic of said power converter; and
    a controller configured to control a duty cycle of at least one power switch to regulate said dc output characteristic of said power converter, wherein the at least one power switch is coupled to the first output terminal of said power converter, wherein said controller includes:
        an error amplifier with first and second input terminals, and
        a switch configured to provide one of said dc output characteristic and a reference voltage of said power converter to said first and second input terminals as a function of a power conversion mode of said power converter, wherein said dc output characteristic is an output voltage and said switch is responsive to a power conversion mode control signal produced by a comparator in accordance with an input voltage of said power converter and said output voltage of said power converter.

2. The system as recited in claim 1 wherein said power converter is operable in different power conversion modes of operation.

3. The system as recited in claim 1 wherein said another output filter capacitor is configured to provide a low impedance bypass for high frequency ripple components at said first and second output terminals of said power converter.

4. The system as recited in claim 1 wherein at least one of said output filter capacitor and said another output filter capacitor is a ceramic capacitor.

5. The system as recited in claim 1 further comprising another filter inductor coupled to said first terminal of said output filter capacitor.

6. The system as recited in claim 1 wherein said output filter inductor is configured to shift down a self resonant frequency of said output filter capacitor.

7. A power converter, comprising:
    a power train, including:
        at least one power switch coupled to a first output terminal of said power converter, and
        an output filter, including:
            an output filter capacitor with a first terminal directly coupled to said first output terminal of said power converter,
            an output filter inductor, directly coupled between a second terminal of said output filter capacitor and a second output terminal of said power converter, selected to stabilize a feedback control loop of said power converter in combination with said output filter capacitor, and
            another output filter capacitor directly coupled to said first and second output terminals, and coupled directly in parallel to said output filter capacitor and said output filter inductor, wherein said first and second output terminals of said power converter are load terminals capable of sustaining a direct current ("dc") output characteristic of said power converter; and
    a controller configured to control a duty cycle of said at least one power switch to regulate said dc output characteristic of said power converter, wherein said controller includes:
        an error amplifier with first and second input terminals, and
        a switch configured to provide one of said dc output characteristic and a reference voltage of said power converter to said first and second input terminals as a function of a power conversion mode of said power converter, wherein said dc output characteristic is an output voltage and said switch is responsive to a power conversion mode control signal produced by a comparator in accordance with an input voltage of said power converter and said output voltage of said power converter.

8. The power converter as recited in claim 7 wherein said power converter is operable in different power conversion modes of operation.

9. The power converter as recited in claim 7 wherein said another output filter capacitor is configured to provide a low impedance bypass for high frequency ripple components at said first and second output terminals of said power converter.

10. The power converter as recited in claim 7 wherein at least one of said output filter capacitor and said another output filter capacitor is a ceramic capacitor.

11. The power converter as recited in claim 7 wherein said output filter further comprises another filter inductor coupled to said first terminal of said output filter capacitor.

12. The power converter as recited in claim 7 wherein said output filter inductor is configured to shift down a self resonant frequency of said output filter capacitor.

13. The power converter as recited in Claim 7 wherein said error amplifier includes an operational amplifier including said first and second input terminals and a feedback path including at least one of a resistor and a capacitor between said first and second input terminals and an output terminal thereof.

14. A method of operating a power converter, comprising:
    providing a power train, including:
        at least one power switch coupled to a first output terminal of said power converter, and
        an output filter, including:
            an output filter capacitor with a first terminal directly coupled to said first output terminal of said power converter,
            an output filter inductor, directly coupled between a second terminal of said output filter capacitor and a second output terminal of said power converter, selected to stabilize a feedback control loop of said power converter in combination with said output filter capacitor, and another output filter capacitor directly coupled to said first and second output terminals, and coupled directly in parallel to said output filter capacitor and said output filter inductor, wherein said first and second output terminals of said power converter are load terminals capable of sustaining a direct current ("dc") output characteristic of said power converter; and controlling a duty cycle of said at least one power switch to regulate said dc output characteristic of said power converter, wherein controlling the duty cycle to regulate said dc output characteristic comprises:

providing one of said dc output characteristic and a reference voltage of said power converter to first and second input terminals of an error amplifier as a function of a power conversion mode of said power converter via a switch, wherein said dc output characteristic is an output voltage and said switch is responsive to a power conversion mode control signal produced by a comparator in accordance with an input voltage of said power converter and said output voltage of said power converter.

15. The method as recited in claim 14 further comprising providing a low impedance bypass for high frequency ripple components at said first and second output terminals of said power converter with said another output filter capacitor.

16. The method as recited in claim 14 wherein at least one of said output filter capacitor and said another output filter capacitor is a ceramic capacitor.

17. The method as recited in claim 14 wherein said output filter inductor shifts down a self resonant frequency of said output filter capacitor.

18. The system as recited in claim 1 wherein said error amplifier includes an operational amplifier including said first and second input terminals and a feedback path including at least one of a resistor and a capacitor between said first and second input terminals and an output terminal thereof.

19. The method as recited in claim 14, wherein said error amplifier includes an operational amplifier including said first and second input terminals and a feedback path including at least one of a resistor and a capacitor between said first and second input terminals and an output terminal thereof.

20. The system as recited in claim 6 wherein said output filter capacitor exhibits a self resonant frequency between 700 and 1500 kHz.

* * * * *